United States Patent
Reutelhuber et al.

(10) Patent No.: US 12,230,281 B2
(45) Date of Patent: Feb. 18, 2025

(54) DOWNMIXER AND METHOD OF DOWNMIXING

(71) Applicant: Fraunhofer-Gesellschaft zur Förderung der angewandten Forschung e.V., Munich (DE)

(72) Inventors: Franz Reutelhuber, Erlangen (DE); Bernd Edler, Erlangen (DE); Eleni Fotopoulou, Erlangen (DE); Markus Multrus, Erlangen (DE); Pallavi Maben, Erlangen (DE); Sascha Disch, Erlangen (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 490 days.

(21) Appl. No.: 17/400,872

(22) Filed: Aug. 12, 2021

(65) Prior Publication Data
US 2021/0375293 A1    Dec. 2, 2021

Related U.S. Application Data

(63) Continuation of application No. PCT/EP2020/055669, filed on Mar. 4, 2020.

(30) Foreign Application Priority Data

Mar. 6, 2019   (EP) ..................................... 19161076

(51) Int. Cl.
*G10L 19/008*   (2013.01)
*G10L 19/087*   (2013.01)
*H04S 3/00*     (2006.01)

(52) U.S. Cl.
CPC .......... *G10L 19/008* (2013.01); *G10L 19/087* (2013.01); *H04S 3/00* (2013.01); *H04S 2400/03* (2013.01)

(58) Field of Classification Search
None
See application file for complete search history.

(56) References Cited

U.S. PATENT DOCUMENTS

| 7,343,281 B2 | 3/2008 | Breebaart et al. |
| 9,681,220 B2 | 6/2017 | Delikaris-Manias et al. |

(Continued)

FOREIGN PATENT DOCUMENTS

| CN | 1864436 A   | 11/2006 |
| CN | 101809656 A | 8/2010  |

(Continued)

OTHER PUBLICATIONS

International Search Report and Written Opinion issued in application No. PCT/EP2020/055669.

(Continued)

*Primary Examiner* — Nicole A K Schmieder
(74) *Attorney, Agent, or Firm* — McClure, Qualey & Rodack, LLP

(57) ABSTRACT

A downmixer for downmixing a multi-channel signal having at least two channels, includes: a weighting value estimator for estimating band-wise weighting values for the at least two channels; a spectral weighter for weighting spectral domain representations of the at least two channels using the band-wise weighting values; a converter for converting weighted spectral domain representations of the at least two channels into time representations of the at least two channels; and a mixer for mixing the time representations of the at least two channels to obtain a downmix signal.

40 Claims, 14 Drawing Sheets

(DOWNMIXER)

(56) References Cited

U.S. PATENT DOCUMENTS

| | | | |
|---|---|---|---|
| 9,743,215 | B2 | 8/2017 | Uhle et al. |
| 2005/0074127 | A1 | 4/2005 | Herre et al. |
| 2006/0178870 | A1 | 8/2006 | Breebaart et al. |
| 2007/0165869 | A1 | 7/2007 | Ojanpera |
| 2010/0023322 | A1 | 1/2010 | Schnell et al. |
| 2010/0198589 | A1 | 8/2010 | Ishikawa et al. |
| 2012/0008799 | A1 | 1/2012 | Disch et al. |
| 2012/0014526 | A1 | 1/2012 | Stoll et al. |
| 2012/0093322 | A1 | 4/2012 | Lee |
| 2012/0224702 | A1 | 9/2012 | Den Brinker et al. |
| 2014/0046670 | A1 | 2/2014 | Moon et al. |
| 2016/0005413 | A1* | 1/2016 | Fellers .............. G10L 19/012 704/205 |
| 2016/0037279 | A1 | 2/2016 | Borne |
| 2016/0269847 | A1 | 9/2016 | Par |
| 2017/0365260 | A1 | 12/2017 | Chebiyyam et al. |
| 2019/0272833 | A1 | 9/2019 | Borss et al. |

FOREIGN PATENT DOCUMENTS

| | | |
|---|---|---|
| CN | 102169693 A | 8/2011 |
| CN | 102598122 A | 7/2012 |
| CN | 103262160 A | 8/2013 |
| CN | 109313906 A | 2/2019 |
| JP | 2009-194877 A | 8/2009 |
| JP | 2013-511062 A | 3/2013 |
| JP | 2017-058696 A | 3/2017 |
| KR | 10-2008-0076691 A | 8/2008 |
| RU | 2 663 345 C2 | 8/2018 |
| TW | 200742275 A | 11/2007 |
| TW | 201830378 A | 8/2018 |
| WO | 2005/086139 A1 | 9/2005 |
| WO | 2007/109338 A1 | 9/2007 |
| WO | 2013/079524 A2 | 6/2013 |
| WO | 2014/083542 A1 | 6/2014 |
| WO | 2018/086946 A1 | 5/2018 |
| WO | 2018/086948 A1 | 5/2018 |
| WO | 2018/193162 A2 | 10/2018 |

OTHER PUBLICATIONS

ITU-R BS.775-2; "Multichannel Stereophonic Sound System With And Without Accompanying Picture;" International Telecommunication Union; pp. 1-13.

Baumgarte, F., et al.; "Audio Coder Enhancement using Scalable Binaural Cue Coding with Equalized Mixing;" 116th Convention of the AES; May 2004; pp. 1-9.

Adami, A., et al.; "Down-mixing using coherence suppression;" IEEE International Conference on Acoustics, Speech and Signal Processing; 2014; pp. 2878-2882.

Anonymous; "Audio mixing (recorded music)—Wikipedia", https://web.archive.org/web/20190302214525/https://en.wikipedia.org/wiki/Audio_mixing_(recorded_music); Mar. 2019; pp. 1-7.

Vilkamo, J., et al.; "Reduction of Spectral Artifacts in Multichannel Downmixing with Adaptive Phase Alignment;" Journal of Audio Engineering Society; vol. 62; No. 7/8; Jul./Aug. 2014; pp. 516-526.

Chinese language office action dated Sep. 14, 2021, issued in application No. TW 109107331.

Notice of Acceptance dated Sep. 18, 2023, issued in application No. AU 2020233210.

Kim, M., et al.; "Stereo audio coding improved by phase parameters;" 129th Convention of the Audio Engineering Society; Nov. 2010; pp. 1-6.

"Information technology—High efficiency coding and media delivery in heterogeneous environments—Part 3: 3D audio;" Jul. 2019; pp. 1-435.

"Universal Mobile Telecommunications System (UMTS); LTE; Codec for Enhanced Voice Services (EVS); Detailed algorithmic description (3GPP TS 26.445; version 16.1.1; Release 16);" Technical specification; Dec. 2020; pp. 1-663.

Chen, S., et al.; "Estimating spatial cues for audio coding in MDCT domain;" IEEE International Conference on Multimedia and Expo; 2009; pp. 1-4.

Chinese language office action dated Jul. 12, 2023, issued in application No. CN 202080019078.1.

Russian language office action dated Jan. 21, 2022, issued in application No. RU 2021128913.

English language translation of office action dated Jan. 21, 2022, issued in application No. RU 2021128913 (pp. 1-6 of attachment).

Japanese language office action dated Nov. 1, 2022, issued in application No. JP 2021-550157.

English language translation of office action dated Nov. 1, 2022, issued in application No. JP 2021-550157 (pp. 11-27 of attachment).

Office Action dated May 15, 2023, issued in application No. SG 11202108895T.

Chinese language office action dated Mar. 21, 2024, issued in application No. CN 202080019078.1.

\* cited by examiner (DOWNMIXER)

DOWNMIXER AND METHOD OF DOWNMIXING

CROSS-REFERENCE TO RELATED APPLICATIONS

This application is a continuation of copending International Application No. PCT/EP2020/055669, filed Mar. 4, 2020, which is incorporated herein by reference in its entirety, and additionally claims priority from European Application No. 19161076.5, filed Mar. 6, 2019, which is also incorporated herein by reference in its entirety.

The present invention is directed to audio signal processing and particularly to downmixing of multichannel signals or spectral resolution converting of audio signals.

BACKGROUND OF THE INVENTION

While a stereo encoded bitstream will usually be decoded to be played back on a stereo system, not all devices that are able to receive a stereo bitstream will be able to output a stereo signal. A possible scenario would be playback of the stereo signal on a mobile phone with only a mono speaker. With the advent of multi-channel mobile communication scenarios as supported by the emerging 3GPP IVAS standard a stereo-to-mono downmix is therefore needed that is free of additional delay and complexity-wise as efficient as possible while also providing the best possible perceptual quality beyond what is achievable with a simple passive downmix.

There are multiple ways of converting a stereo signal to a mono signal. The most direct ways of doing it is by a passive downmix [1] in time-domain which generates a mid-signal by adding the left and right channels and scaling the result:

$$Mid = \frac{(Left + Right)}{2}$$

Further more sophisticated (i.e. active) time-domain based downmixing methods include energy-scaling in an effort to preserve the overall energy of the signal [2] [3], phase alignment to avoid cancellation effects [4] and prevention of comb-filter effects by coherence suppression [5].

Another method is to do the energy-correction in a frequency-dependent manner by calculation separate weighting factors for multiple spectral bands. For instance, this is done as part of the MPEG-H format converter [6], where the downmix is performed on a hybrid QMF subband representation or with an STFT filterbank of the signals with additional prior phase alignment of the channels. In the IVAS context a similar band-wise downmix (including both phase and temporal alignment) is already used for the parametric low-bitrate mode DFT Stereo where the weighting and mixing is applied in the DFT domain [7].

The simple solution of a passive stereo-to-mono downmix in time-domain after decoding the stereo signal is not ideal as it is well known that a purely passive downmix comes with certain shortcomings, e.g. phase cancellation effects or general loss of energy, which can—depending on the item—severely degrade the quality.

Other active downmixing methods that are purely time-domain based mitigate some of problems of the passive downmix but are still suboptimal due to the lack of frequency-dependent weighting.

With the implicit constraints for mobile communication codecs like IVAS in terms of delay and complexity, having a dedicated post-processing stage like the MPEG-H format converter for applying a band-wise downmix is also not an option as the needed transforms to frequency domain and back will inevitably cause an increase in both complexity and delay.

For a Stereo codec mode that utilizes TCX transform coding with block switching as in [8], there can be different modes that can be used: e.g. one block per frame with a block size of 20 ms (TCX20) and two subblocks per frame with a block size of 10 ms (TCX10). Each subblock is either a full TCX10 block of 10 ms or is again subdivided into two blocks of 5 ms (TCX5). The decision which of the modes to use is made for each channel independently from the other. This means that it is possible to have different decisions between the channels. This makes it impossible to use the exact same downmixing method as used at the DFT-based Stereo encoder as described in [7] (band-wise weighting of the channels, then mono-downmix both in the DFT domain) due to the different time-frequency resolutions of the respective spectral domain representations.

SUMMARY

According to an embodiment, a downmixer for downmixing a multi-channel signal having at least two channels may have: a weighting value estimator for estimating band-wise weighting values for the at least two channels; a spectral weighter for weighting spectral domain representations of the at least two channels using the band-wise weighting values; a converter for converting weighted spectral domain representations of the at least two channels into time representations of the at least two channels; and a mixer for mixing the time representations of the at least two channels to obtain a downmix signal.

According to another embodiment, a downmixer for downmixing a multi-channel signal having at least two channels may have: a weighting value estimator for estimating band-wise weighting values for the at least two channels, wherein the weighting value estimator is configured to calculate the band-wise weighting values based on a target energy value per band, so that an energy in the band of a downmix signal is in a predetermined relation to energies in the same bands of the at least two channels; a spectral weighter for weighting spectral domain representations of the at least two channels using the band-wise weighting values to obtain weighted spectral domain representations; and a mixer for calculating the downmix signal using the weighted spectral domain representations of the at least two channels.

According to another embodiment, a method for downmixing a multi-channel signal having at least two channels may have the steps of: estimating band-wise weighting values for the at least two channels; weighting spectral domain representations of the at least two channels using the band-wise weighting values; converting weighted spectral domain representations of the at least two channels into time representations of the at least two channels; and mixing the time representations of the at least two channels to obtain a downmix signal.

According to another embodiment, a method of downmixing a multi-channel signal having at least two channels may have the steps of: estimating band-wise weighting values for the at least two channels, including calculating the band-wise weighting values based on a target energy value per band, so that an energy in the band of a downmix signal is in a predetermined relation to energies in the same bands of the at least two channels; weighting spectral domain representations of the at least two channels using the band-wise weighting values to obtain weighted spectral domain representations; and calculating the downmix signal using the weighted spectral domain representations of the at least two channels.

Another embodiment may have a non-transitory digital storage medium having a computer program stored thereon to perform the inventive methods when said computer program is run by a computer.

In accordance with a first aspect of the present invention, a downmixer comprises a weighting value estimator, a spectral weighter, a converter and a subsequently connected mixer. The conversion from the spectral domain into the time domain is performed subsequent to the spectral weighting of the spectral domain representation of a first channel and a weighting of the spectral domain representation of a second channel and, as the case may be, the spectral weighting of spectral domain representations of further channels. The weighted spectral domain representations are converted from the spectral domain representation into a time representation of the corresponding channel. In the time domain, the mixing is performed in order to obtain a downmix signal as the output of the downmixer. This procedure allows to perform a useful and efficient but nevertheless high audio quality weighting in the spectral domain, but still allows the individual processing of the individual channels in the spectral domain compared to a situation, where spectral domain weighting and downmixing is performed in a single operation. In such a situation, it is not possible anymore to perform individual channel processing, since, subsequent to the spectral weighting and downmixing, the single downmix signal is there. Thus, in accordance with this aspect of the present invention, it is made possible to nevertheless perform an individual channel processing in the spectral domain, but this individual processing in the spectral domain is performed subsequent to the spectral weighting.

In a situation where the at least two channels have different time or frequency resolutions, the calculation of the band-wise weighting values for the at least two channels needs to convert either one or both spectral domain representations of the at least two channels for the individual bands into corresponding representations that have the same time or frequency resolution. The band-wise weighting values can be calculated. However, in this aspect, the band-wise weighting values are not applied to the converted spectral domain representation or the two or more combined spectral representations. Instead, the spectral weighting is applied to the original spectral domain representation, from which the combined spectral domain representation has been derived. Thus, it is made sure that the weighted spectral domain representations rely on the original spectral domain representations and only the weighting values that are anyway based on certain estimates for energy, using a target energy for a band in the channels before downmixing and a target energy for a band of the downmix signal, are derived from one or more combined spectral domain representations that are at least in some respect different from the original spectral domain representations.

The converter for converting the weighted spectral domain representations into time representations has several components. One component is the actual frequency-time converter and a further component is a channel-wise post processing in the time domain using parameters that have been transmitted via, for example, side information with the multi-channel signal, from which the spectral domain representations come from. Alternatively, the post-processor is applied before the actual frequency-time conversion. The control parameters steer a spectral domain processing of the individual channels. However, it is advantageous to have the frequency-time converter first and to have the post-processor for post-processing time domain representations of the at least two channels using channel-wise control parameters that are derived from side information of the multi-channel signal or that are actually generated or input at the down-mixer via user input or any other parameter generation. Subsequent to this time domain post-processing, the mixer is there that actually generates the downmix signal.

This procedure provides a high quality audio signal processing due to the application of the band-wise weighting values to the original spectral domain representations, and due to the fact that the band-wise weighting values that are anyway based on some kind of power or image estimate are derived from one or more (artificially-created) combined spectral domain representation(s). On the other hand, a high processing flexibility is achieved due to the fact that any probably needed time domain or frequency domain processing of individual channels can still be performed, since the actual mixing step is the last step in the processing chain that occurs, when all needed individual channel processings have been applied. Furthermore, this procedure is highly efficient, since this procedure does not need any downmixing of control parameters or so that would be needed, when the actual downmixing operation would be the first processing operation in the processing chain.

In accordance with a second aspect of the present invention, an apparatus for converting a spectral resolution comprises a spectral value calculator for combining spectral values belonging to the same frequency bin from each sub-frame of a plurality of sub-frames of one or more spectral domain representations in a first manner to obtain a first group of combined spectral values and for combining spectral values belonging to the same frequency bin from each sub-frame of the spectral domain representation in a second manner to obtain a second group of combined spectral values. This second manner is different from the first manner and the first and second groups of combined spectral values represent a combined spectral domain representation having a different time bin size and a different frequency bin size. This spectral resolution conversion is particularly useful, when there exists a pair of spectral representations coming from a short time-frequency transform showing a high time resolution but a low frequency resolution.

In accordance with the second aspect of the invention, this pair of short spectral domain representations is converted into a single long spectral domain representation having a high spectral resolution but having a low time resolution. This conversion from one time/frequency resolution (high time resolution and low frequency resolution) into a different time/frequency resolution (low time resolution and high frequency resolution) takes place without any actual calculation of a time domain representation in between. Thus, instead of the normal procedure that would consist of converting the two short spectral domain representations into the time domain and to again convert the result into the frequency domain, the present invention only applies a spectral domain combination of spectral values belonging to the same frequency bin in two different manners. Thus, in contrast to the performing of two frequency-time conversions and one time-frequency conversion that is highly inefficient and incurs a significant delay, the present invention only provides needs basic arithmetic combination operations such as adding two values or subtracting two values from each other in order to obtain, from the two low frequency resolution spectral domain representations a high spectral domain representation. The first combination rule is a low-pass filtering or, in other words, an addition or a weighted addition of the two spectral values belonging to the same low resolution frequency bin, while the combination of the spectral values in accordance with the second manner is a high-pass filtering or a calculation of a difference between the two spectral values. The corresponding two adjacent serial spectral values are converted into two frequency-adjacent spectral values, where one of the two frequency-adjacent spectral values is the lower frequency spectral value coming from the low pass filtering operation and the next one is the higher frequency spectral value coming from the high pass operation.

The next procedure is that the next pair of high spectral resolution spectral values is calculated again in the same procedure, i.e., performing a first combination for the lower frequency spectral value typically representing a low pass characteristic and performing another combination for the higher frequency spectral value representing a high pass operation for the higher frequency spectral value of the pair of spectral values.

The combined spectral domain representation generated in accordance with the second aspect of the present invention can be used for different purposes. In the first aspect of the invention, the combined spectral domain representation is used for deriving the band-wise weighting values. This is particularly useful, when a first channel spectral domain representation has a low time resolution and a high spectral resolution, and a second channel of the at least two channels has two high time resolution spectral domain representations that both have a low is converted and, from the combined spectral domain representation generated by the converting, the band-wise weighting values can be derived. In a further usage, the combined spectral domain representation can be further processed by means of any useful further processing such as converting in the time domain and using the converted spectrum for the purpose of replaying or storing or audio signal compressing. Another procedure would be to perform a spectral processing of the combined spectral domain representation together with another spectral representation that has the same spectral resolution, for example for the purpose of spectral-domain downmixing.

In accordance with a third aspect of the present invention, the downmixing operation is performed using spectral weighting, where the band-wise weighting values are calculated based on a target energy value per band, so that an energy in the band of a downmix signal is in a predetermined relation such as equal or equal within a tolerance range of +/−30% of the higher value of the two energies in the same bands of the at least two channels. The energy-driven band-wise weighting values are applied to spectral domain representations of the at least two channels and the downmix signal is calculated using the weighted spectral domain representations of the at least two channels either in the time domain as in the first aspect of the invention or in the spectral domain as needed.

In a case, where the spectral domain representations are purely real, such as in an MDCT transform or when the spectral domain representations are purely imaginary such as when applying an MDST (modified discrete sine transform), the weighting value estimator is configured to estimate, from the existing spectral domain representation that it is either purely real or purely imaginary, the other spectral domain representation. Thus, when a real-valued spectral domain representation exists, the imaginary spectral domain representation is estimated, and when an imaginary spectral domain representation exists, the real-valued spectral domain representation is estimated. These estimated values are used for calculating an energy of the first channel in the band, for calculating an energy of the second channel in the band, and for calculating mixed terms between the channels depending on a product or a linear combination of spectral values from the at least two channels in the band.

This procedure of calculating the band-wise weighting values for a spectral weighting in the context of a downmixing can be applied in the first aspect, where, between the spectral weighting and the downmixing, the frequency-time transform and some time domain post processing occurs. Regarding the second aspect of the invention, the spectral domain representation of one or both channels that are used for calculating the spectral domain weighting values in accordance with the target energy feature are derived either from the original spectral domain representations or are derived from one or two combined spectral domain representations as have been generated by the spectral resolution conversion illustrated with respect to the second aspect of the invention or illustrated with respect to the first aspect.

The downmixing using spectral weighting using band-wise weighting values that are derived based on a target energy value per band is, on the one hand, highly efficient due to the fact that the spectral weighting can be easily performed by applying one and the same weighting value to each spectral value in a band, particularly, when psycho-acoustically motivated bandwidths are applied that increase from small bandwidths at low frequencies to high bandwidths at high frequencies. When, for example, a high band is considered that has, for example, 100 or more spectral values, only a single weighting value for this band is calculated and this single weighting value is applied to each individual spectral value. For this procedure, only moderate computational resources are involved, since weighting by means of, for example, multiplication is a low resource and low delay procedure and, at the same time, this procedure of applying the same weighting value to each spectral value in a band has a high potential to be parallelized by means of certain parallel hardware processors. On the other hand, a high audio quality of the downmix signal is obtained that is free of signal cancellations or other artifacts that occur, when the two channels that are to be dowmixed are in a phase relation to each other that is problematic in downmixing, i.e., when both channels are highly correlated with each other and have a certain phase relationship.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
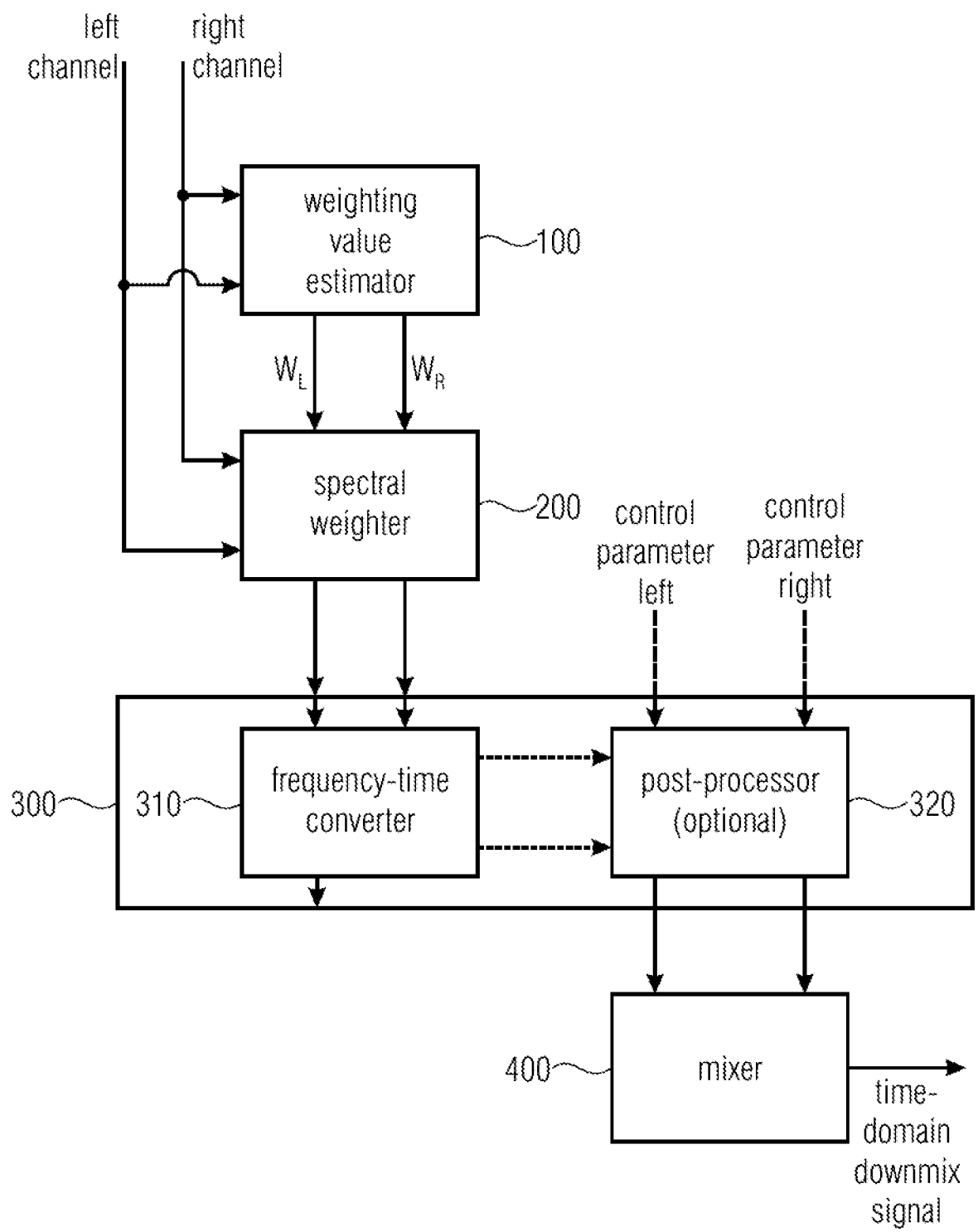
FIG. 1 illustrates a downmixer in accordance with a first aspect.

FIG. 1 illustrates an embodiment of a downmixer for the first aspect of the present invention. The downmixer comprises a weighting value estimator 100, a spectral weighter 200 connected with the weighted value estimator 100 and an input for a first or left channel and a second or right channel. The spectral weighter 200 is connected to a converter 300 for converting weighted spectral domain representations of the at least two channels into time representations of the at least two channels. These time representations are output to a mixer for mixing the time representations of the at least two channels to obtain a time-domain downmix signal. The converter 300 comprises a frequency-time converter 310 and a subsequently connected post-processor 320. The frequency-time converter 310 actually performs the conversion of the weighted spectral domain representations in the time domain and the post-processor 320 that is an optional feature performs a channel-independent processing of the first channel and the second channel already present in the time domain using control parameters for the left channel and the right channel, respectively. The converter 300 is configured to generate, by means of the frequency-time converter 310, the raw time representations using a spectrum-time conversion algorithm and, additionally, the converter 300 is configured to post-process, by means of the post-processor 320, the raw time representations individually, and, particularly, in signal processing direction before the mixing by the mixer using separate control information for the channels to obtain the time representations of the at least two channels.

The post processor 320 is configured to perform, as the post-processing operation, a bass post-filtering, a TCX-LTP processing (transform coded excitation long term prediction), or an LPC (linear prediction coding) synthesis. The advantage of the post-processor operating on the spectrally weighted channels, but operating before the actual mixing into the downmix signal is that parameters that are available as separate parameters for the left and the right channel or, generally, for an individual channel of the two or more channels of the multi-channel signal can still be used without any parameter downmixing. Such a procedure would, otherwise, be needed when the downmixing would be performed together with the spectral weighting so that, at the output of the frequency-time converter 310 there would already exist a time domain downmix signal.

Generally, the multi-channel signal may comprise two channels, i.e., left channel and the right channel, or the multi-channel signal comprises more than two channels such as three or more channels. In such a situation, the weighting value estimator 100 is configured to calculate a plurality of first band-wise weighting values for a plurality of bands of a first channel of the at least two channels and to calculate a second plurality of band-wise weighting values for the plurality of bands of a second channel of the at least two channels. Furthermore, the weighting value estimator 100 is configured to calculate the plurality of first band-wise weighting values for a plurality of bands of a first channel of the multi-channel signal having more than two channels and to calculate a second plurality of band-wise weighting values for the plurality of bands of a second channel of the more than two channels and to calculate the further plurality of band-wise weighting values for the plurality of bands of a third or even further channel of the more than two channels.

Particularly, the spectral domain representations of the at least two channels each comprise a set of frequency bins, where spectral values are associated with the frequency bins. Particularly, the weighting value estimator 100 is configured to calculate the band-wise weighting values for bands, where each band comprises one, two or more spectral values and the number of frequency bins per band increases with bands having a higher center frequency so that the psychoacoustically motivated subdivision of the spectral domain representations into bands with non-uniform bandwidths is obtained.

Figure 2:
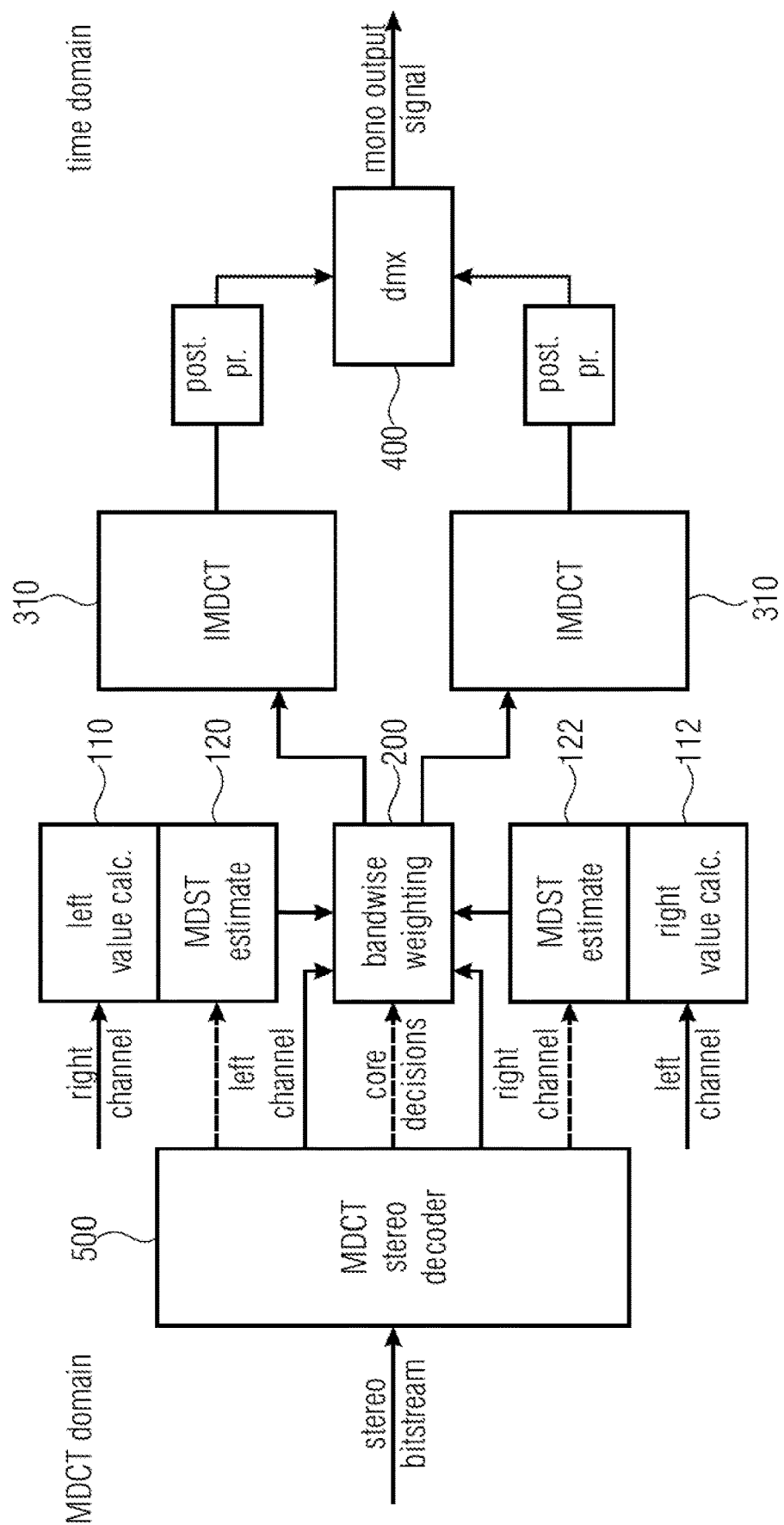
FIG. 2 illustrates a further embodiment of the downmixer in accordance with the first aspect.

An implementation for the downmixer is illustrated in FIG. 2. The multi-channel signal is available as a stereo bitstream and is fed into a stereo decoder 500 that is implemented as an MDCT stereo decoder. Furthermore, the weighting value estimator comprises a left value calculator 110, a right value calculator 112 and, additionally, an imaginary part estimator 120 for the left channel and an imaginary part estimator 122 for the right channel. In the embodiment in FIG. 2, the stereo decoder 500 is an MDCT stereo decoder which means that the decoded left and right channel spectral representations have purely real spectral values, i.e., MDCT values. The imaginary estimators 120, 122 will generate purely imaginary spectral values, i.e., MDST (modified discrete sine transform) values. From these information items, i.e., the spectral domain representations and the estimated spectral values, the weighting factors are calculated and forwarded to the spectral weighter 200 performing a band-wise weighting as indicated in FIG. 2. The weighted spectral domain representations are forwarded to corresponding frequency-time converters 310 that are implemented as an IMDCT converter for each channel. Furthermore, an optional post-processor 320 is illustrated as well for each channel and, the transformed and optionally post processed data is input into the downmixer DMX 400 to generate the time-domain downmix signal that is, in the embodiment in FIG. 2, a mono output signal, but can also be a multichannel signal as long as the number of one or more channels of the downmix signal is lower than the number of channels of the multichannel signal before downmixing.

Alternatively, when the multi-channel decoder or stereo decoder 500 is implemented as an imaginary value decoder such as an MDST decoder, blocks 120, 122 would estimate purely real data such as MDCT values. Thus, in general, the weighting value estimator 100 is configured to estimate an imaginary spectral representation when the spectral domain representation is purely real or to estimate the real spectral representation when the original spectral domain representation is purely imaginary. Furthermore, the weighting value estimator 110 is configured to estimate the weighting values using the estimated imaginary spectral representation or the estimated real spectral representation, as the case may be. This is particularly useful for a calculation of spectral band-wise weighting values that is based on a target energy value per band, so that an energy in a band of the downmix signal is in a predetermined relation to energies in the same bands of the at least two channels. The predetermined relation is that the energy in a band of the downmix signal is the sum of the energies of the same bands in the at least two channels. However, other predetermined relations are useful as well. Exemplarily, the predetermined relation may span from 75% to 125% of the sum of the two channels as the energy of the corresponding band of the downmix signal. However, in a most advantageous embodiment, predetermined relation is the equality or the equality within a tolerance range of +/−10%.

Figure 3A:
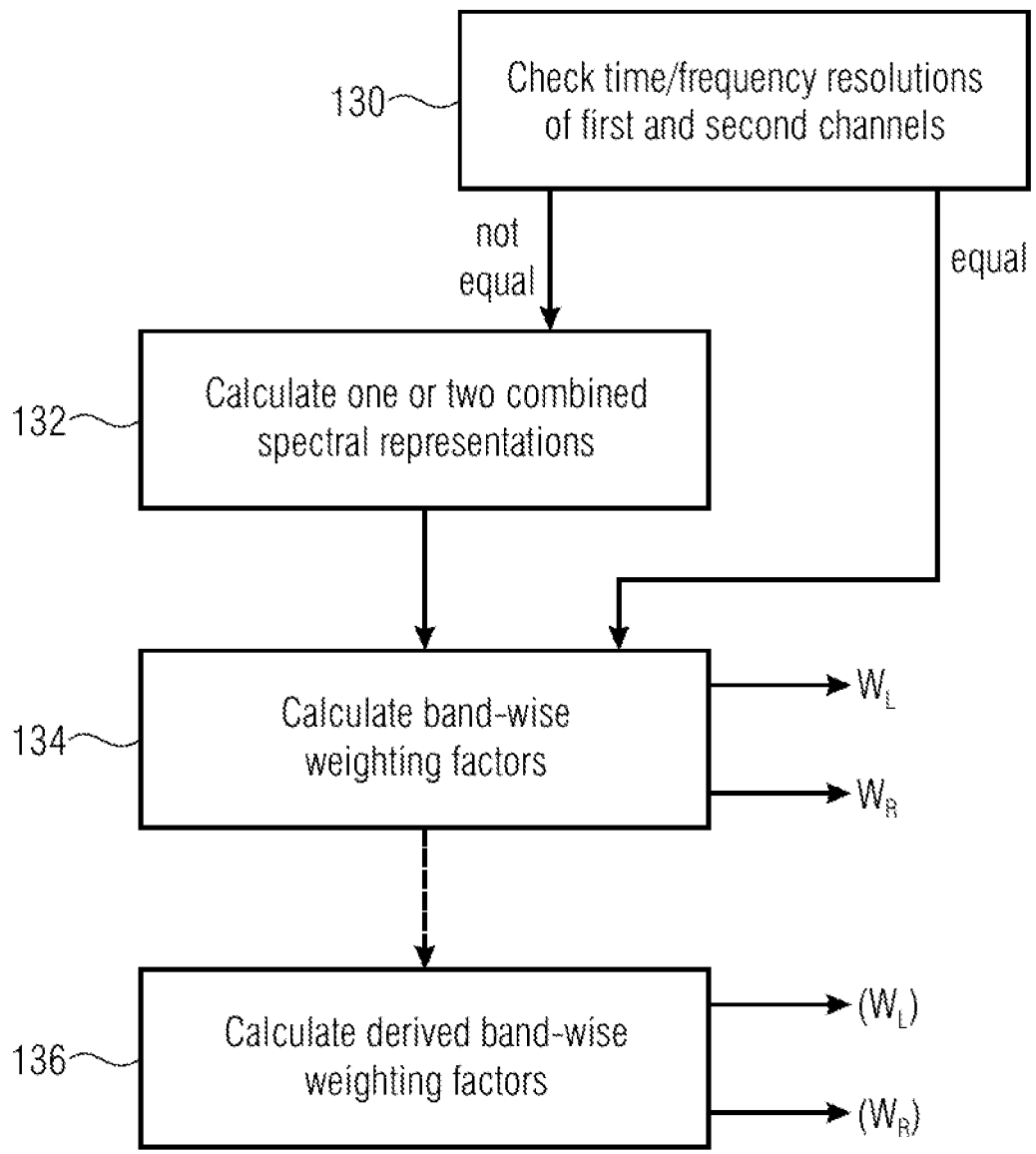
FIG. 3a illustrates an implementation of the weighting value estimator.

FIG. 3a illustrates an implementation of the weighting value estimator 100. Particularly, this implementation is useful for calculating the weighting values when the spectral domain representations of the at least two channels have different time or frequency resolutions. As shown in block or step 130, the weighting value estimator 100 is configured to check, whether the time/frequency resolutions of the spectral domain representations of the first and the second channels are different from each other. In case of equal time or frequency resolutions, the weighting value estimator 100 is configured to calculate the band-wise weighting factors or band-wise weighting values as indicated by $w_L$ for the first or left channel and as indicated by $w_R$ for the second or right channel.

Alternatively, when it is determined by the weighting value estimator 100 in block 130 that the time or frequency resolutions are not equal between the left and right or first and second channels for a certain time period as later illustrated with respect to FIG. 4a, the weighting value estimator 100 is configured to calculate 132 one or two combined spectral domain representations. Particularly, a first spectral domain representation of a first channel of the at least two channels has a first time resolution or a first frequency resolution, and a second spectral domain representation of a second channel of the at least two channels has a second time resolution or a second frequency resolution, wherein the second time resolution is different from the first time resolution or wherein the second frequency resolution is different from the first frequency resolution. The weighting value estimator 100 is configured to convert or calculate 132 the first spectral domain representation into a combined spectral domain representation having the second time resolution or the second frequency resolution and to calculate the band-wise weighting values using the combined spectral domain representation and the second spectral domain representation. Alternatively, the second spectral domain representation is converted into a combined spectral domain representation having the first time resolution or the first frequency resolution and the band-wise weighting values are calculated using the combined spectral domain representation and the first spectral domain representation. Alternatively, when the first spectral domain representation of a first channel has a first time resolution or a first frequency resolution and the second spectral domain representation of a second channel of the at least two channels has a second time resolution or a second frequency resolution, wherein the second time resolution is different from the first time resolution or wherein the second frequency resolution is different from the first time resolution, the weighting value estimator 100 is configured to convert or calculate 132 the first spectral domain representation into a first combined spectral domain representation having a third time resolution or a third frequency resolution, where the third time resolution is different from the first time resolution or the second time resolution and where the third frequency resolution is different from the first frequency resolution and/or the second frequency resolution. Furthermore, the second spectral domain representation is also converted into a second combined spectral domain representation having the third time resolution or the third frequency resolution and the band-wise weighting values are calculated using the first combined spectral domain representation and the second spectral domain representation. Depending on the actual situation as later described with respect to FIGS. 5a to 5d, there can also be the situation that the band-wise weighting values or factors calculated by block 134 are not used for actually spectrally weighting, but derived band-wise weighting factors are calculated as illustrated at 136 in FIG. 3a.

Generally, and assuming that the first channel has a low first time resolution and a high first frequency resolution and also assuming that the second channel has a high second time resolution and a low second frequency resolution, the functionality of the weighting value estimator 100 can select one of four different ways for doing the matching between the resolutions between the first and the second channel in the spectral domain in order to calculate spectral domain weighting values for these channels.

Figure 5A:
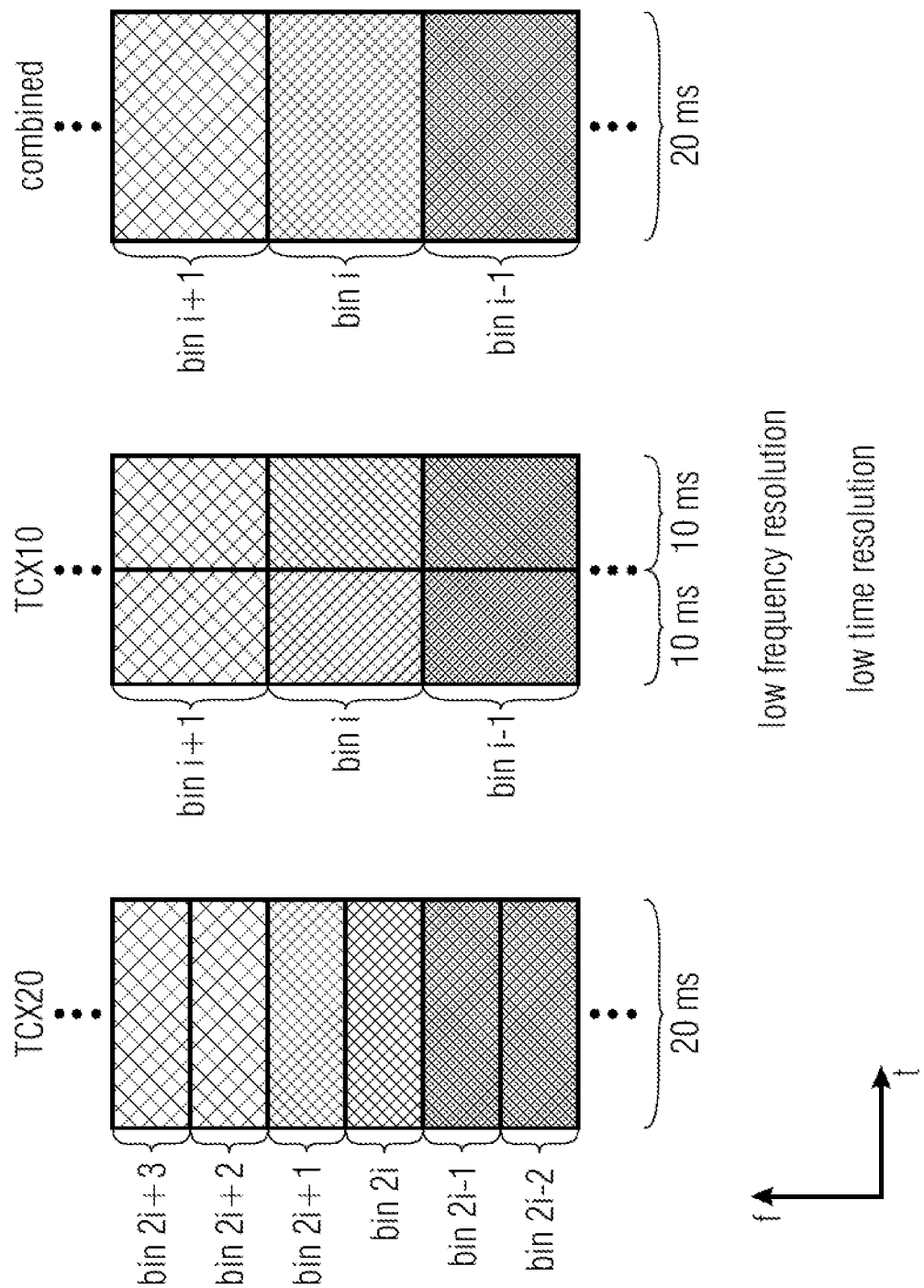
FIG. 5a illustrates weighting value estimation in accordance with the first embodiment resulting in a low frequency resolution and a low time resolution.

FIG. 5a illustrates a first embodiment, where band-wise weighting values are calculated from two combined spectral domain representations where the two combined spectral domain representations both have a low frequency resolution and a low time resolution.

Figure 5B:
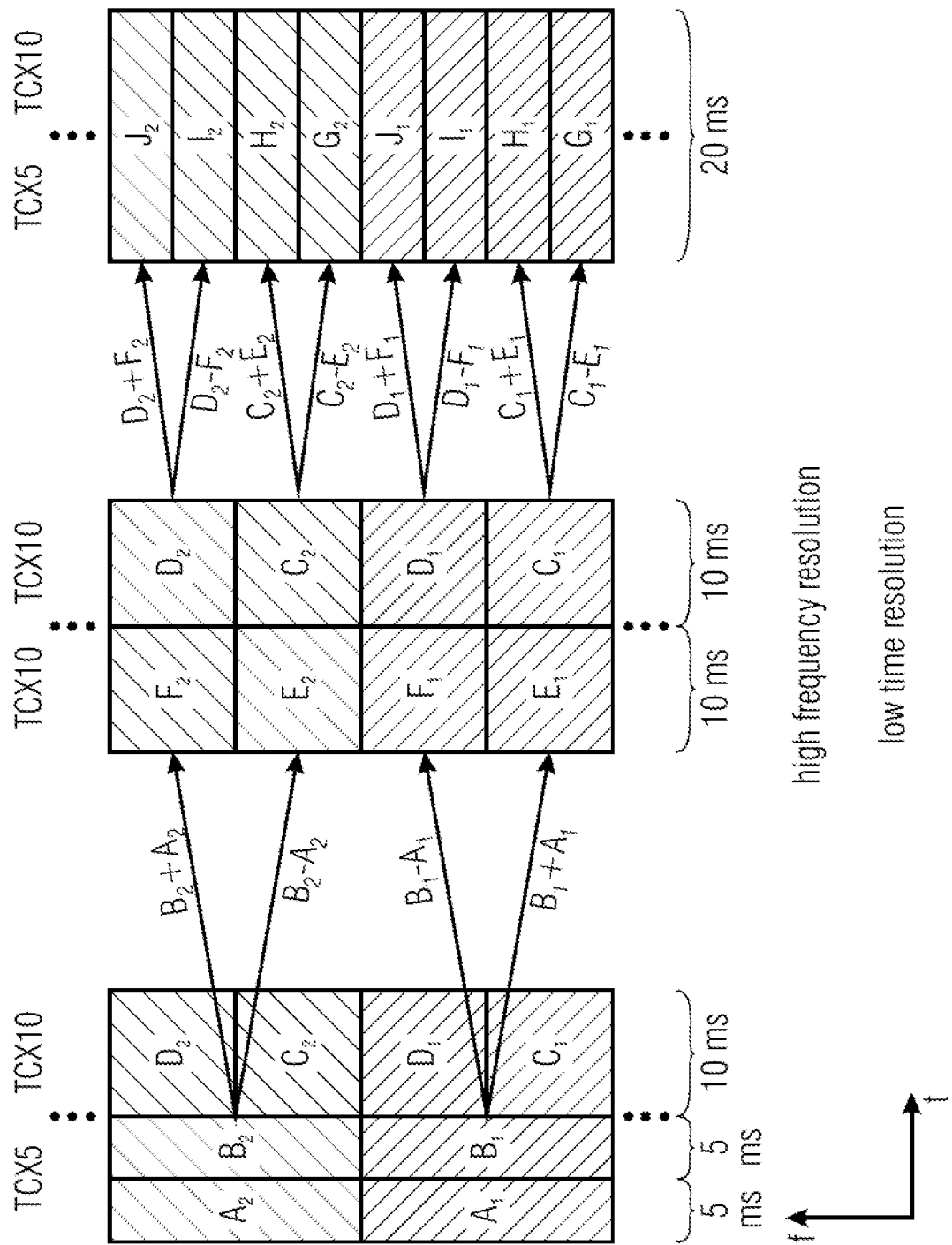
FIG. 5b illustrates a procedure performed by the weighting value estimator in accordance with a second embodiment resulting in a high frequency resolution and a low time resolution that is also applied in accordance with the second aspect.

In the second embodiment illustrated in FIG. 5b, only a single combined spectral domain representation is calculated from the low frequency resolution representation so that the band-wise weighting values are calculated from a pair of spectral domain representations both having the high frequency resolution and the low time resolution.

Figure 5C:
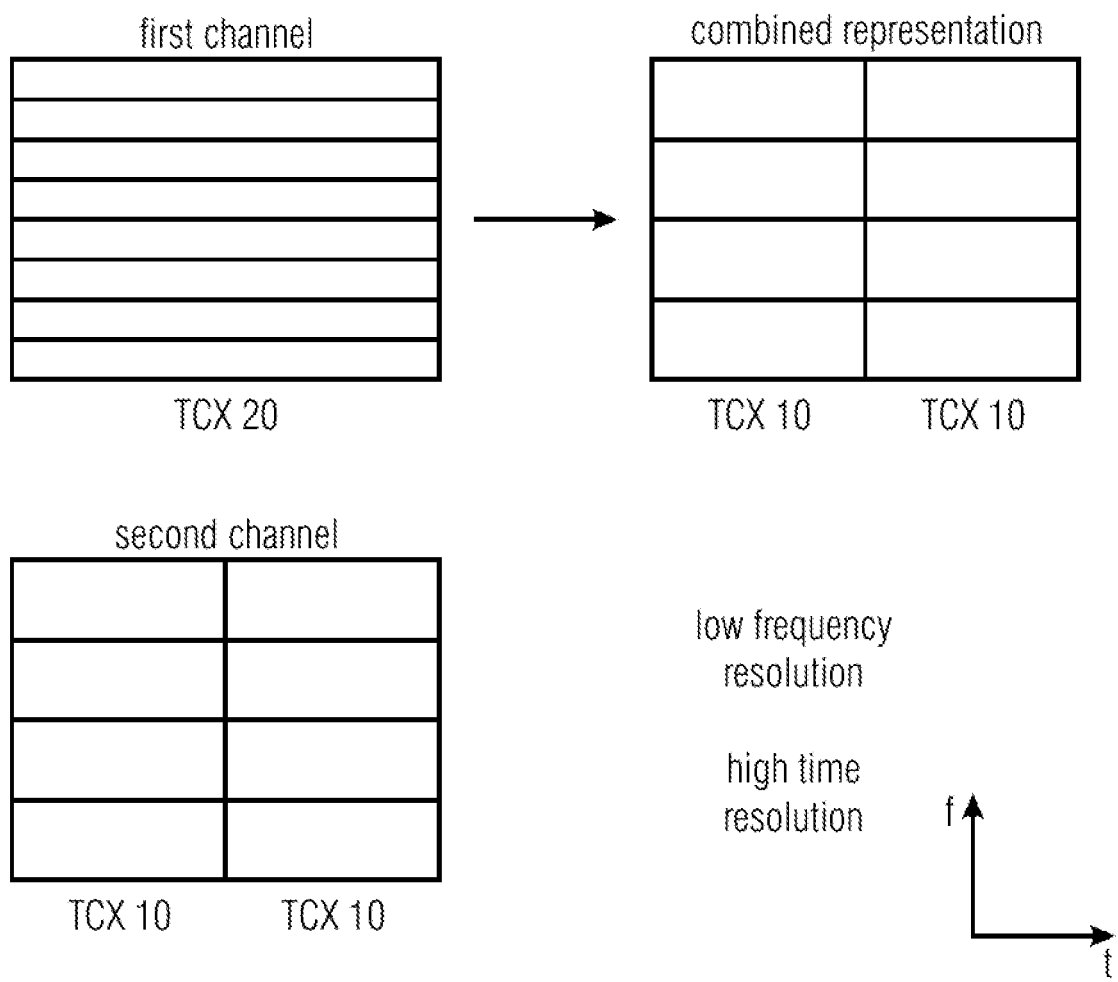
FIG. 5c illustrates an implementation of the weighting value estimation in accordance with a third embodiment resulting a low frequency resolution and a high time resolution.

FIG. 5c illustrates a further third embodiment, where a single combined representation is calculated and used for the calculation of the spectral domain band-wise weighting values using two spectral domain representations both having the low frequency resolution and the high time resolution.

Figure 5D:
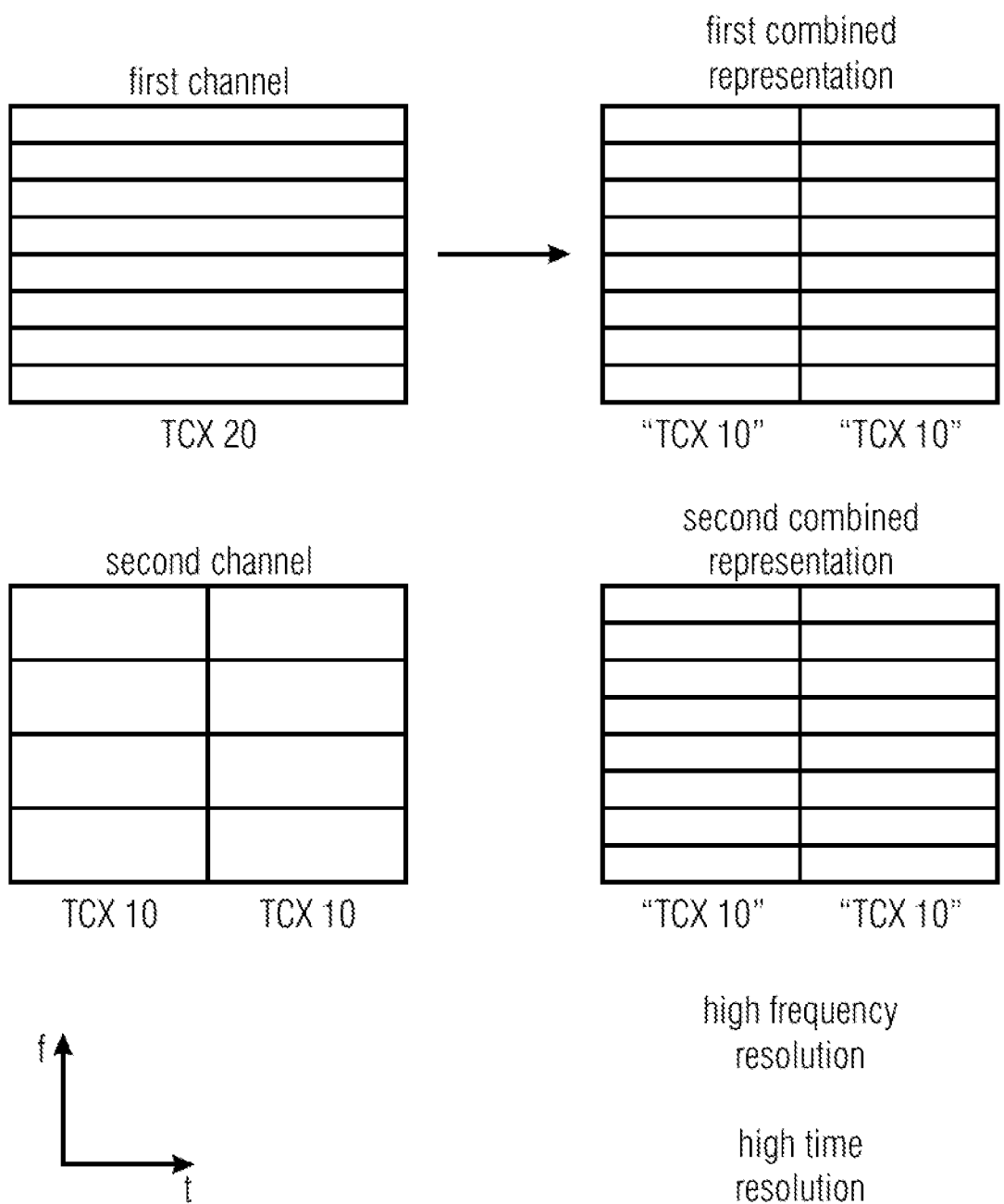
FIG. 5d illustrates a further procedure of the weighting value estimator resulting in a high frequency resolution and a high time resolution.

In a fourth embodiment illustrated in FIG. 5d, the weighting value estimator is configured to calculate the band-wise weighting values using two combined representations that are both in a format that shows the high frequency resolution and the high time resolution.

Figure 4A:
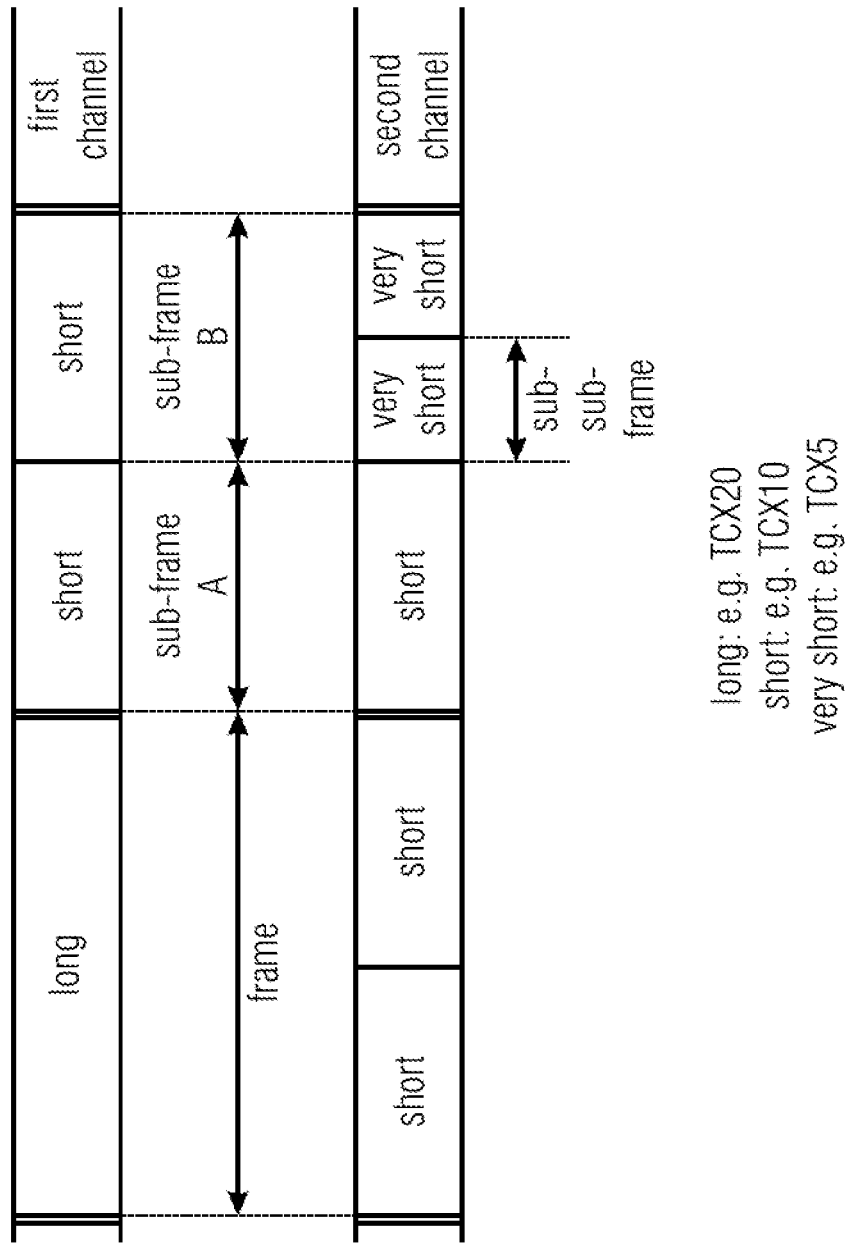
FIG. 4a illustrates different time/frequency resolutions in different channels.

FIG. 4a illustrates a situation, where there are two different resolutions (in time and/or frequency) in the first channel and the second channel. The first portion in FIG. 4a shows a frame having a long block in the first channel and two subsequent short blocks in the second channel. The long block can, for example, be a TCX20 block. The short blocks can be two subsequent TCX10 blocks. Furthermore, FIG. 4a illustrates a further frame which is subdivided into two sub-frames A, B, where, in the first channel, the sub-frame A has a short block and, in the second channel, the sub-frame has a short block as well. However, in sub-frame B of the second frame of FIG. 4a, the first channel has a short block and the second channel has two very short blocks, i.e., one very short block for each sub-sub-frame. The very short block can, for example, be TCX5 blocks. Generally, the long blocks are longer than the short blocks and the short blocks are longer than the very short blocks and, of course, the very short blocks are shorter than the long blocks. Naturally, it is not needed that one long block has the same length as two short blocks. Alternatively, there can be three short blocks having a combined length being equal to the length of one long block or there can be four short blocks such as a very short block for each sub-sub-frame. Other subdivisions can be there as well, i.e., that two long blocks in the first channel have a combined length being equal to the length of three short blocks in the second channel. The lengths of the long, short and very short blocks do not necessarily have to be in an integer relation to each other. Furthermore, there can even be more than three different block lengths such as more than three block lengths or only two different block lengths.

Figure 4B:
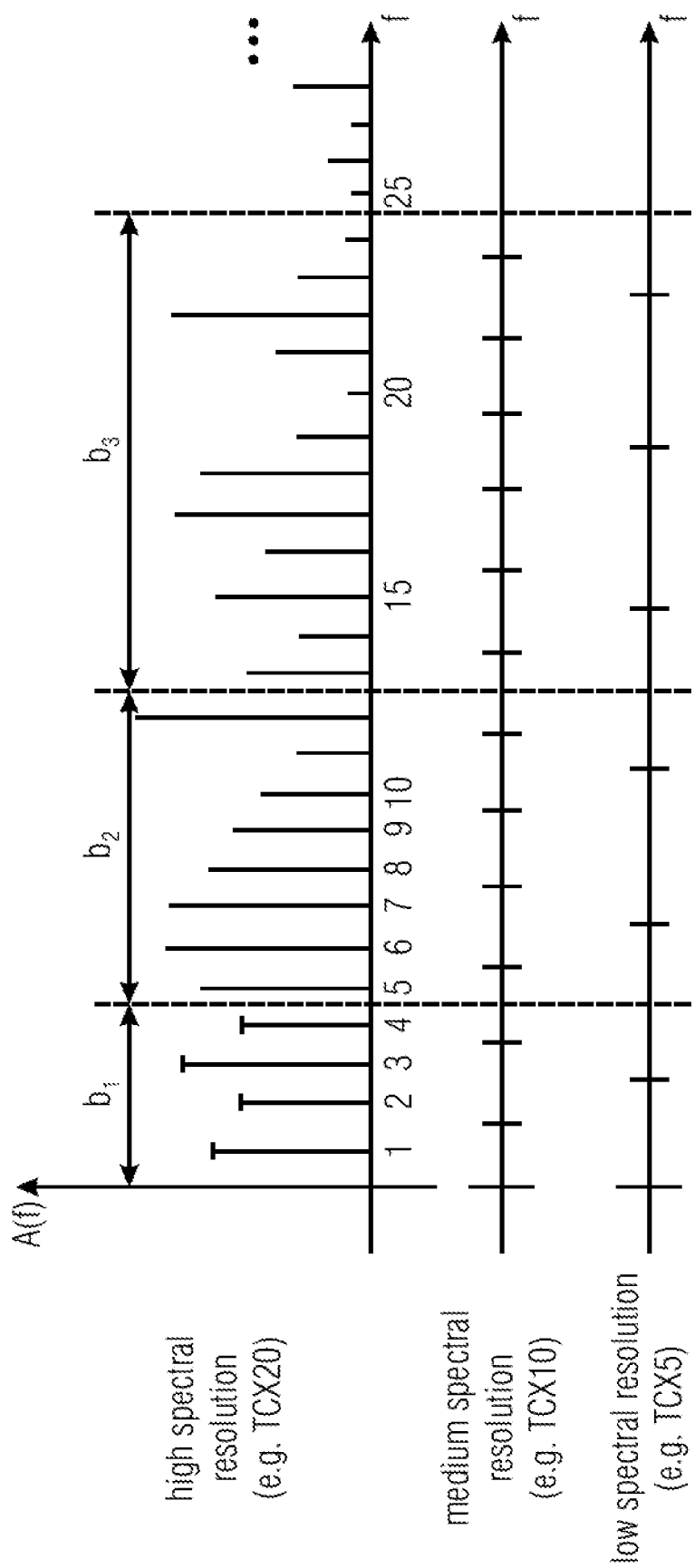
FIG. 4b illustrates a spectral representation showing a high spectral resolution, a medium spectral resolution and a low spectral resolution.

FIG. 4b illustrates a representation of a spectrum with a high spectral resolution in the first line. Spectral values are indicated at integer numbers along the frequency line and FIG. 4b illustrates three subsequent bands $b_1$, $b_2$, $b_3$, where each band representing higher frequencies is broader than each band representing lower frequencies. In the high spectral resolution situation such as in a TCX20 spectrum, the lowest band $b_1$ has four spectral lines or spectral values or spectral bins. The second band $b_2$ has, in the embodiment, eight spectral values and the third spectral band $b_3$ has twelve spectral bins.

Transferring or converting the high spectral resolution into a medium spectral resolution representation results in the fact that, from the high resolution spectral representation, spectral values are combined (or decimated) so that the medium spectral resolution such as a TCX10 resolution has two spectral bins for the first band, four spectral bins for the second band $b_2$ and six spectral bins for the third band $b_3$. Once again comparing this medium spectral resolution with a low spectral resolution representation such as occurring in a TCX5 block, the first band would only have a single frequency bin, the second $b_2$ would have two frequency bins and the third spectral band $b_3$ would have three spectral bins. The medium spectral resolution could be converted into the low spectral resolution by combining two or more adjacent spectral lines or by a decimation operation.

On the other hand, a low spectral resolution representation could be converted into a higher resolution representation by means of interpolation or copying or copying and filtering so that, for example, from the two spectral bins in the first band $b_1$ for the medium spectral resolution, four high resolution spectral bins 1, 2, 3, 4 as illustrated in FIG. 4b could be calculated.

This novel approach aims at providing a delay-less, active, band-wise downmixing method for stereo-to-mono conversion where only the band-wise weighting of the spectral bands of the two channels is done in frequency domain while the actual downmix to a mono signal is done after transforming to time-domain by summing and scaling the two spectrally weighted signals.

In case the spectral domain representations of both signals have different time-frequency resolutions (i.e. shorter block size for one signal), the weight calculation is adapted by combining neighboring spectral bins both temporally and spectrally so that the cross-spectra computation can be done on the same time-frequency regions. With this method the time-frequency resolution of the two stereo channel does not need to be uniform as a band-wise weighting of channels can still be done if the channels differ in this regard while the critical stereo-to-mono conversion is done later when both spectrally weighted channels are already transformed back to time-domain. Embodiments provide an optimized, delay-less stereo-to-mono downmix at a decoder side.

Aspects relate to an active downmix with band-wise weighting with separated weighting (frequency-domain) and mixing stages (time-domain).

Further aspects relate to a temporal/spectral combination of frequency bins for cross-spectra correlation in case of channels with different spectral domain representations, where these aspects can be used separate from the downmix aspects or together with the downmix aspects.

Different from parametric Stereo codecs like [7], where only an already downmixed core signal is transmitted along with several side parameters representing the stereo image, there is no downmix available at the decoder for an MDCT-based discrete Stereo application where both channels are directly coded with a TCX coder. Thus, the downmix has to be generated entirely at the decoder side.

Figure 3B:
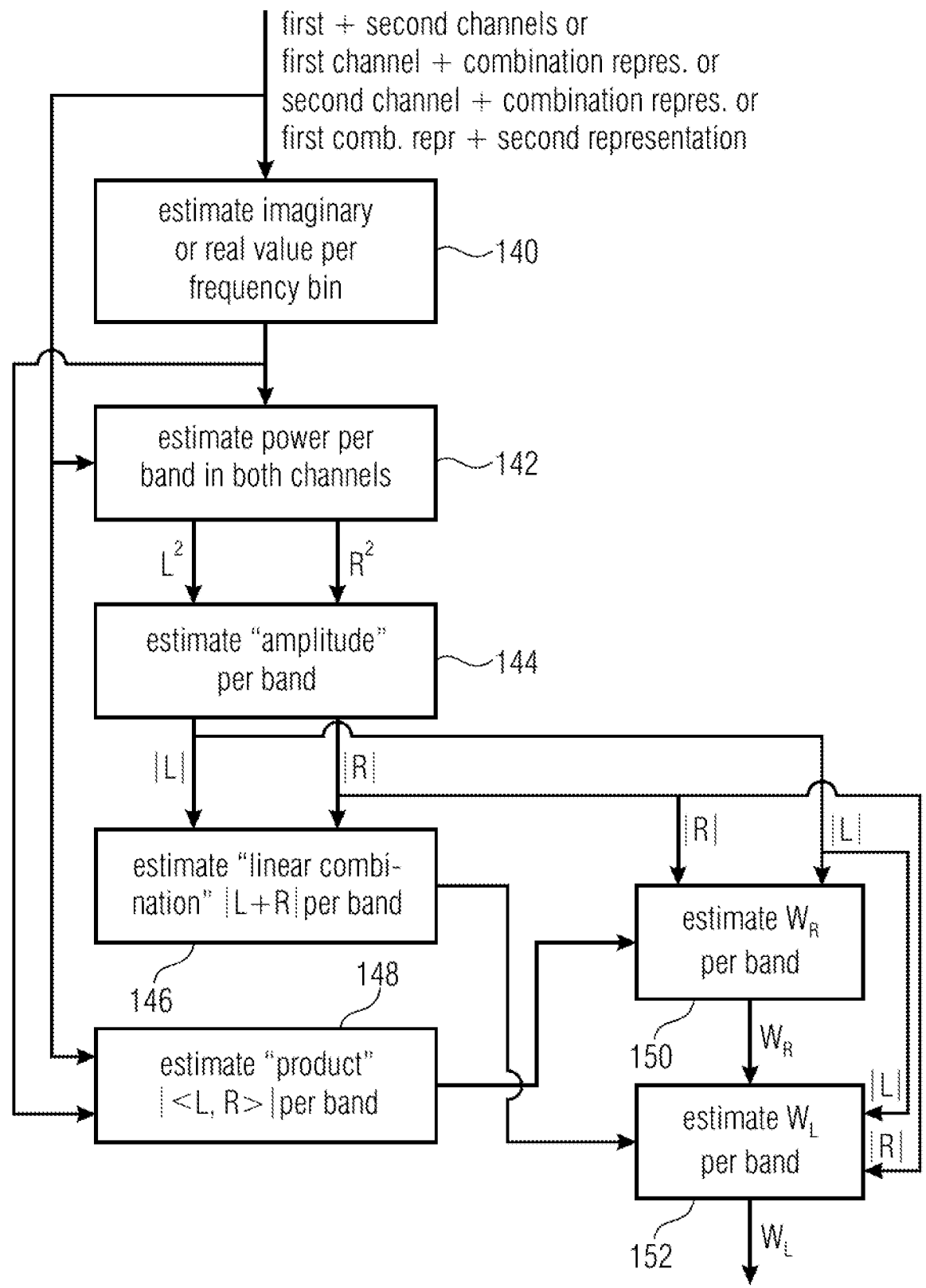
FIG. 3b illustrates an embodiment of the weighting value estimator that is advantageous also for the third aspect.

FIG. 3b illustrates an implementation of the weighting value estimator 100 illustrated in FIG. 1. In step 140, the weighting value estimator estimates corresponding imaginary or real value spectral values per frequency bin from the first channel and the second channel or, alternatively, from the first channel and a combined spectral domain representation or from the second channel and the combined spectral domain representation or from a first combined spectral domain representation and a second combined spectral domain representation. Generally, the weighting value estimator is configured to calculate the first weighting value and the second weighting value using an energy of the first channel in the band, and energy of the second channel in the band and a mixed term depending on a product or a linear combination of spectral values from the at least two channels in the band. In FIG. 3b, the energy of the first channel and the energy of the second channel is exemplarily calculated in block 140. Furthermore, a mixed term depending on a product is calculated in block 148 and another mixed term depending on a linear combination is calculated in block 146. Furthermore, an "amplitude" per band that corresponds to a square root of the power of the spectral bins per band is calculated in block 144.

Thus, as illustrated in FIG. 3b, the first weighting value $w_L$ is calculated from the amplitudes per band for both channels and depending on a mixed term and the mixed term depending on the linear combination illustrated in block 146. Furthermore, it is advantageous that the weighting vector $w_L$ per band is calculated using the weighting value $w_R$ per band, i.e., for the other channel. The value for the other channel, i.e., $w_R$ per band is calculated based on the mixed term depending on the product illustrated at 148 and the "amplitudes" per band derived by block 144 from the powers per band in the corresponding channels as determined in block 142.

Thus, a square root of an energy of spectral values added to each other in the band from the spectral domain representations of the at least two channels is used as the "amplitudes", but other "amplitudes" can be used as well such as "amplitudes" derived from the powers by an exponent being lower than 1 and different from ½. The spectral values from a band are linearly combined, i.e., added to each other and a square root or any other exponentiation with an exponent lower than 1 of the resulting value is taken, where the powers both for the channels in the band are additionally used.

As the mixed term representing the product, an absolute value of a complex dot product between the spectral values in the band of the first channel and the spectral values in the band of the second channel can be determined as well, for example, in the calculation of block 148. The same weight as determined by the spectral weighter 200 is applied to each spectral value in the band of one of the at least two channels and another weight is applied to each spectral value in the band of another channel of the at least two channels.

Subsequently, an implementation of the calculation of the weighting factors per band as can be used by the weighting value estimator 100 is illustrated.

As the usage of a passive downmix has its disadvantages as stated above, using an active downmixing scheme leads to significant improvements for many items. Adding another decoder stage including a DFT transform for both channels after the stereo decoding is not feasible for both complexity and delay reasons, so the downmixing process is done as a combination of MDCT domain and time domain processing.

First, band-wise weights are computed and applied to the MDCT representations of both channels. This happens after the Stereo processing (e.g. inverse MS etc.) and directly before the IMDCT back transform. The weights are computed with the same scheme that is already used at the DFT-based Stereo encoder described in [7], targeting the energy of the phase-rotated mid-channel:

$$E_{target} = \left|\frac{L + Re^{-j\varphi}}{2}\right|^2 = \frac{\langle L, L\rangle + \langle R, R\rangle + 2|\langle L, R\rangle|}{4} = \frac{|L|^2 + |R|^2 + 2|\langle L, R\rangle|}{4},$$

where L and R represent the left and right channel spectral magnitudes. Based on this target energy the weight for the channels can be then computed for each spectral band as follows:

$$w_R = \frac{1}{2\sqrt{2}} \frac{\sqrt{|L|^2 + |R|^2 + 2|\langle L, R\rangle|}}{|L| + |R|}$$

and $$w_L = w_R + 1 - \frac{|L + R|}{|L| + |R|}.$$

These weights or band-wise weighting values $w_R$ and $w_L$ are computed per spectral band with each band encompassing several MDCT bins starting with a low number of bins for the lowest bands e.g. 4 and increasing towards higher frequencies up to several or many bins for the highest band e.g. 160.

As the transmitted MDCT coefficients are only real-valued, the complementary MDST values that are needed for energy-preserving weighting are obtained for each channel by the estimate [9]

$$MDST_i = MDCT_{i+1} - MDCT_{i-1},$$

where i specifies the spectral bin number.

Using this estimate $|L|$ and $|R|$ are computed for each band b as $$|L| = \sqrt{\sum_{i\ in\ b}(MDCT_{i,l}^2 + MDST_{i,l}^2)}, |R| = \sqrt{\sum_{i\ in\ b}(MDCT_{i,r}^2 + MDST_{i,r}^2)}$$

$|L+R|$ is computed as $$|L + R| = \sqrt{|L|^2 + |R|^2 + 2\left(\sum_{i\ in\ b}(MDCT_{i,l}MDCT_{i,r} + MDST_{i,l}MDST_{i,r})\right)^2}$$

and $|\langle L, R\rangle|$ is computed as the magnitude or absolute value of the complex dot product $$|\langle L, R\rangle| = \sqrt{\left(\sum_{i\ in\ b}(MDCT_{i,l}MDCT_{i,r} + MDST_{i,l}MDST_{i,r})\right)^2 + \left(\sum_{i\ in\ b}(MDST_{i,l}MDCT_{i,r} - MDCT_{i,l}MDST_{i,r})\right)^2}$$

where i specifies the bin number inside spectral band b.

In spite of the different transform and only estimated energies, the resulting weights still lead to a similar downmix as in [7].

In a second step, the two weighted channels are then downmixed in time domain by simple summing and scaling of the two spectrally weighted channels.

Reference is made to FIG. 2.

The reason for this combined approach is twofold: for one, by transforming both channels back to time domain, post-filtering, e.g. TCX-LTP—which also operates in time domain—can run on both channels using the parameters (e.g. pitch) extracted from the core coding of the individual channels, thus avoiding the need to try and find averaged parameters that fit the downmix. Secondly, and more critically, MDCT Stereo is configured to allow different core coder and/or overlap decisions for the two channels. Concretely, this means that one channel can be coded with e.g. one TCX20 long block (20 ms frame, higher frequency resolution, lower time resolution) while the other is coded with e.g. two TCX10 short blocks (2×10 ms subframes, lower frequency resolution, higher time resolution) where one or both short blocks may again be divided into two TCX5 subframes (2×5 ms). This makes a complete frequency domain downmix virtually impossible. The band-wise weighting alone, however, can be done directly in MDCT domain.

One embodiment illustrated in FIG. 5a works as follows: For the special case of different cores in the two channels the computation of the cross-spectra correlation as part of the weight calculation has to be slightly adapted. Due to the different frequency and time resolutions of TCX20 and TCX10, directly calculating the dot product between left and right is not possible. Instead, the MDCT bins have to be combined so that they cover the same time-frequency regions. For TCX20 this means combining two neighboring bins while for TCX10 each bin of the first subframe has to combined with the same bin in the following subframe, for example $$MDCT_{i,l,combined} = MDCT_{2i,l} + MDCT_{2i+1,l}$$

And $$MDCT_{i,r,combined} = MDCT_{i,k0,r} + MDCT_{i,k1,r}$$

if $MDCT_l$ is a TCX20 MDCT spectrum and $MDCT_r$ a TCX10 MDCT spectrum with 2 subframes where i specifies the spectral bin number and k0 and k1 the TCX10 subframes. The same combination is also done with the estimated MDST spectra.

The cross-spectra correlation $|\langle L, R \rangle|$ and/or the value for $|L+R|$ is then computed with the resulting combined bins. This leads to a somewhat coarser correlation estimate but has been found to be fully sufficient.

Another embodiment illustrated in FIG. 5b works as follows: For the special case of different cores in the two channels the computation of the cross-spectra correlation as part of the weight calculation has to be slightly adapted. Due to the different frequency and time resolutions of TCX20 and TCX10, directly calculating the dot product between left and right is not possible. In order to make it possible, the spectrum of the (sub)frame with the lower spectral resolution is converted into an approximation of a spectrum with twice the spectral resolution by computing:

$$MDCT_{2i,k0} = \frac{1}{2}(MDCT_{i,k1} + (-1)^i MDCT_{i,k0})$$

and $$MDCT_{2i+1,k0} = \frac{1}{2}(MDCT_{i,k1} - (-1)^i MDCT_{i,k0})$$

where i specifies the spectral bin number and k0 and k1 the subframes with lower resolution. These additions and subtractions can be seen as high- and lowpass filtering operations that split one lower-resolution bin into two higher-resolution bins where the filtering depends on whether the bin number i is even or odd (starting with i=0 for the lowest bin).

This means that if one channel is TCX20, the other channel is converted to the same spectral resolution. If one or both of the subframes of the other channel are subdivided again into two TCX5 "sub-subframes", these are first converted to TCX10 resolution by the same filtering before splitting again to arrive at the final TCX20 representation Even if none of the channels is TCX20, conversion to the higher resolution may still be needed for one or both subframes in case there is TCX10 in one channel and TCX5 in the other. As an example, if the left channel is TCX10 in subframe A and 2×TCX5 in subframe B, while the right channel is 2×TCX5 in subframe A and TCX10 in subframe B, both channels will be converted to have TCX10 resolution in both subframes (convert subframe B for left channel, A for right channel). If in the same example the right channel is also TCX 10 for subframe A and 2×TCX5 for B, then no conversion is done; i.e. subframe A will be downmixed with TCX10 resolution, B with TCX5.

The MDST estimates and the final channel weights are then computed using these converted spectra. The weights themselves are applied to the original input spectra which means that in case of a conversion each computed weight is applied to all bins covering the same frequency range in the original lower resolution for every subframe.

By separating the weighting stage of an active band-wise downmix from the actual mixing stage the new method is able to output a mono signal with the advantages of the active downmix, but without additional delay or complexity and independent of the chosen time-frequency resolution of the individual channels.

It also allows the use of further time domain post processing (e.g. TCX-LTP post-filter using pitch information) on both channels without the need of a dedicated parameter downmix.

FIG. 5a illustrates the first alternative, where two combined spectral domain representations are generated. The first combined spectral domain representation is calculated by adding two neighboring bins of the high resolution spectral domain representation illustrated to the left of FIG. 5a to obtain the first combined spectral domain representation.

Furthermore, the two low spectral resolution representations illustrated at TCX10 in the middle of FIG. 5a are combined to each other in order to obtain the second combined spectral domain representation. The weighting value estimator 100 is configured to calculate the left and the right weighting factors $w_L$ and $w_R$ from these two combined spectral domain representations.

With respect to the actually performed spectral weighting performed by the spectral weighter 200, the weighting factor for the left channel is applied to the original left channel representation, i.e., the TCX20 representation illustrated to the left of FIG. 5a. Furthermore, the band-wise weighting values for the right channel represented by two time-subsequent TCX10 blocks are applied to both TCX10 blocks. The same band-wise weighting value is applied to the corresponding bands of the two time-subsequent TCX10 blocks illustrated in the middle of FIG. 5a.

In the second alternative illustrated in FIG. 5b, only a single combined spectral domain representation is calculated as illustrated for several different cases. When, for example, a sub-frame in the first channel has two very short such as TCX5 frames and the next sub-frame has a single TCX10 frame, and when the second channel has, for example, two TCX10 frames, the combined spectral domain representation is calculated for the first sub-sub-frame while, for the second sub-sub-frame, the first and the second channel already are in the TCX10 representation.

In this example, the spectral weighter 200 is configured to apply the high spectral resolution weighting factors to corresponding bands in the sub-frames each representing five milliseconds, for example. Furthermore, the high resolution weighting factors are applied to corresponding original spectral domain representations of the other channel having a short TCX10 frame in the first sub-frame A, for example.

Alternatively, the situation is so that the first channel has a representation illustrated to the left of FIG. 5b and the second channel has a representation illustrated to the right of FIG. 5b, the representation of the first channel is converted into a single combined spectral domain representation via the two steps from the left in FIG. 5b to the middle and from the middle in FIG. 5b to the right. The frequency resolution is used for calculating the weighting factors and the corresponding weighting factors are applied to the high frequency resolution and low time resolution representation of the second channel that would have a resolution illustrated to the right in FIG. 5b, and the same values for a band would be applied to all the individual sub-frames A, B and the next sub-frame illustrated by D and C in FIG. 5b.

FIG. 5c illustrates another alternative where the actual domain weighting values are calculated from a low frequency resolution and a high time resolution representation. The first channel is, for example, a TCX20 representation and the second channel is, for example, a sequence of two TCX10 representations. In contrast to the alternative illustrated in FIG. 5b, the combined representation is now a high time resolution and low frequency resolution representation illustrated in the upper right corner of FIG. 5c. The spectral domain weighting factors are calculated from the combined representation on the one hand and the original spectral domain representation of the second channel illustrated in the lower left corner of FIG. 5c.

Two sets of band-wise weighting values are obtained, i.e., one for each sub-frame. These values are applied to the corresponding sub-frames of the second channel. However, due to the fact that the first channel only has a single spectral domain representation for the whole frame, derived spectral domain weighting values are calculated as illustrated at block 136 in FIG. 3a. One procedure for calculating a derived spectral domain weighting value is to perform a weighted addition of the corresponding weighting values of one and the same band for the two (or more) sub-frames, wherein each weighting value is, for example, weighted by means of 0.5 in the weighted addition resulting in an averaging operation. Another alternative would be to calculate an arithmetic or geometric mean of the weighting values for the two sub-frames or any other procedure to obtain a single weighting value from two weighting values for a band in a frame. An option could be simply to select one of the two values and to neglect the other one, etc.

Furthermore, for calculating the combined spectral domain representation from the first channel, a procedure as discussed before with respect to FIG. 5a can be used, i.e., two neighboring spectral values can be added together to reduce the spectral resolution. This is also illustrated in FIG. 4b where the high spectral resolution having a certain number of spectral values in a band can be reduced to the medium spectral resolution having a lower number of spectral values in the same band. Furthermore, in order to double the spectral values for the two sub-frames illustrated in the upper right corner of FIG. 5c one can, for example, use the same (low spectral resolution) spectral values for a band in both sub-frames, or one can perform some kind of weighted decimation using earlier or later values, as the case may be.

FIG. 5d illustrates a further implementation where the first channel has a high frequency and low time resolution representation such as a TCX20 representation, and the second channel has a low frequency and high time resolution representation such as a sequence of two short frames such as two TCX10 frames. The first combined spectral domain representation is a high frequency resolution and high time resolution representation and the second combined spectral domain representation is, additionally, a high frequency resolution and a high time resolution. The procedure illustrated in FIG. 5d can, for example, be performed in such a way that, from the first channel, the first combined spectral domain representation is calculated by taking the same spectral values, but now for two subsequent time frames illustrated by TCX10. Alternatively, some kind of interpolation processing, etc., can be performed as well in order to double the number of frames so that, from a TCX20 frame, two subsequent TCX10 frames are calculated. Furthermore, the second channel is already in the correct time resolution but the frequency resolution has to be doubled. To this end, a procedure from a lower line to a higher line in FIG. 4b can be performed, i.e., the spectral value in a frequency bin of TCX10 representation can be processed to have the same spectral value for a pair of frequency bins. In order to have correct energy, some kind of weighting can be performed. Alternatively or additionally, some kind of advanced interpolation can be performed so that the frequency bins adjacent to each other in the second combined spectral domain representation do not necessarily have exactly the same spectral value but different values. The spectral domain weighting values are calculated by the weighting value estimator 100 from the first combined spectral domain representation and the second combined spectral domain representation that are derived from high frequency resolution and high time resolution data.

The spectral weighter 200 is configured to apply the corresponding spectral domain weighting values to the second channel where for each sub-frame a set of band-wise weighting values exists. For the purpose of weighting the first channel TCX20 data, the weighting value estimator 100 is configured to once again calculate derived bandwise weighting factors 136, since only one set of spectral domain weighting factors is needed for weighting the first channel high frequency resolution and time resolution (TCX20) spectral domain representation. A combination procedure to calculate the derived band-wise weighting values could be an averaging, for example.

Figure 6:
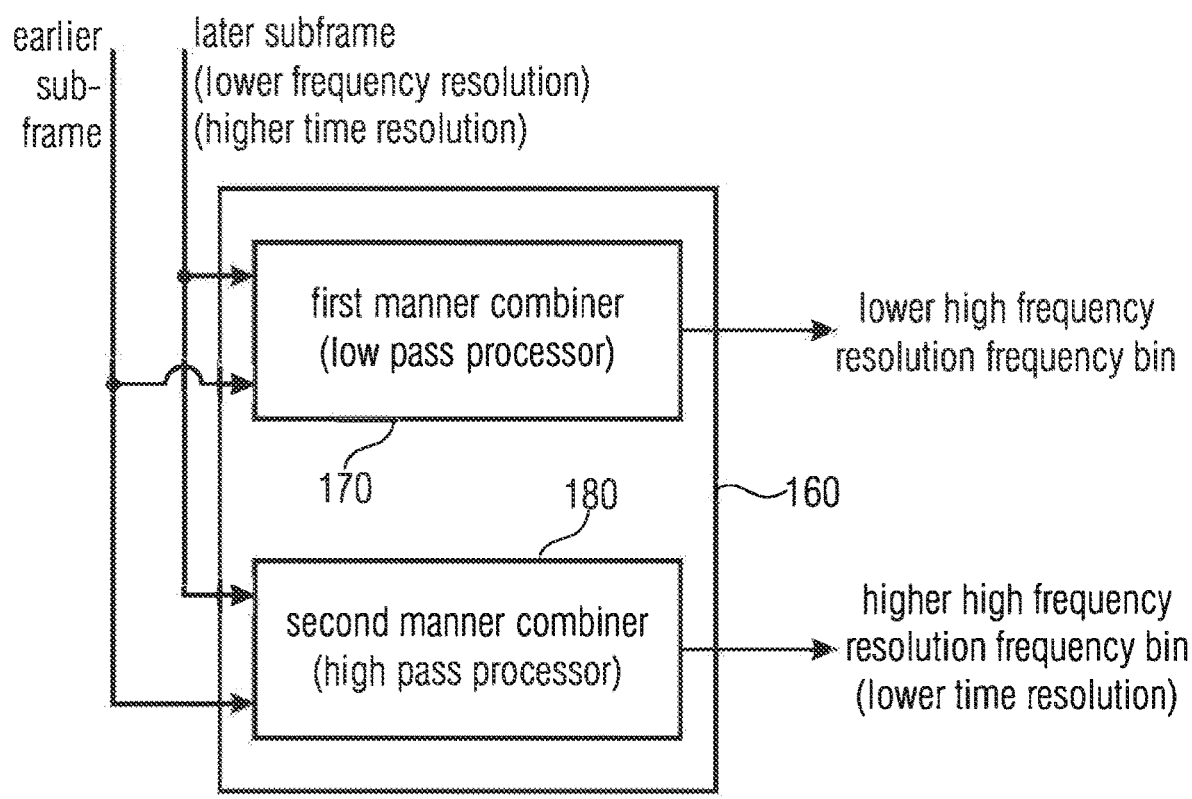
FIG. 6 illustrates an embodiment of an apparatus for converting a spectral resolution in accordance with the second aspect.

FIG. 6 illustrates a further aspect of the invention, i.e., an apparatus for converting a spectral resolution of a spectral domain representation of a channel comprising at least two sub-frames, wherein each sub-frame comprises a plurality of spectral values representing a time bin size and a frequency bin size. The spectral resolution calculator 160 included in the apparatus for converting, in accordance with the second aspect, comprises a first manner combiner 170 and a second manner combiner 180. The first manner combiner operates as a low pass processor and the second manner combiner operates a high pass processor. The spectral value calculator combines, by means of the first manner combiner, spectral values belonging to the same frequency bin from each sub-frame of the spectral domain representation to obtain a first group of combined spectral values and the second manner combiner 180 combines spectral values belonging to the same frequency bin from each sub-frame of the spectral domain representation in a second manner to obtain a second group of combined spectral values, where the second manner is different from the first manner and where the first group of combined spectral values and the second group of combined spectral values represent a combined spectral domain representation having a different time bin size and a different frequency bin size. An implementation of this calculation is described and illustrated with respect to FIG. 5b where, in one illustration, the sequence of $A_2$, $A_1$ and $B_2$, $B_1$ is converted into a high spectral resolution representation but now having a low time resolution as illustrated by $F_2$, $E_2$ on the one hand and $F_1$, $E_1$ on the other hand.

Alternatively, FIG. 5b also illustrates the situation where the at least two sub-frames are illustrated in the middle chart of FIG. 5b as being two time-subsequent 10 ms sub-frames and where the high spectral resolution and low time resolution representation is illustrated to the right of FIG. 5b. An addition is performed in the first manner and a subtraction is performed in the second manner. Furthermore, it is advantageous that both procedures also comprise an average function. Furthermore, the spectral resolution calculator 160 in FIG. 6 is configured to apply either the first manner or the second manner comprising a weighting using a weighting sign, where the spectral value calculator is configured to set the weighting sign in accordance with a frequency bin number of the same frequency bin. Furthermore, the spectral value calculator is, as illustrated in FIG. 5b, configured to transform a lower resolution bin into two higher resolution bins where the first manner is used for an even bin number and the second manner is used for an odd bin number.

Figure 7:
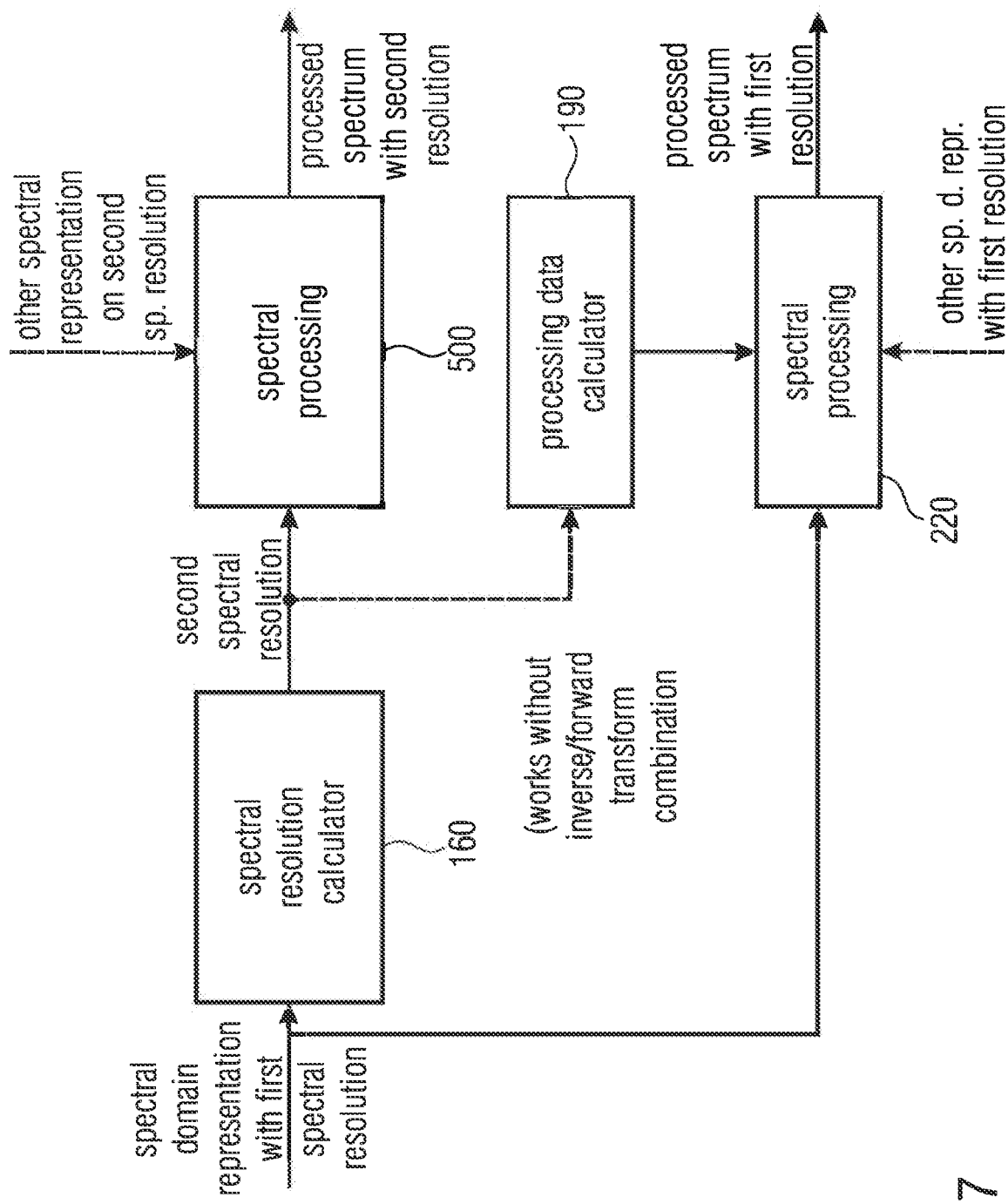
FIG. 7 illustrates a further implementation of the apparatus for converting a spectral resolution in accordance with the second aspect.

FIG. 7 illustrates a further implementation of the apparatus for converting a spectral resolution. In addition to the spectral resolution calculator 160, the apparatus for converting a spectral resolution may comprise further elements. The further elements are, for example, a spectral processor 500 and/or a processing data calculator 190 and/or a further spectral processor 220. In the implementation with the spectral processor 500, the converted spectral domain representation that has been converted without any inverse and forward transform operations and, therefore, has been generated with low computational resources and low delay can be further processed alone or, for example, together with another spectral representation that has the same second spectral resolution. This can, for example, be performed for some kind of downmixing. The high frequency resolution low time resolution representation illustrated to the right of FIG. 5b can not only be used for calculating processing data but is actually further processed for additional or other alternative usage such as, for example, downmixing or any kind of audio rendering in a later processing stage.

On the other hand, the procedure discussed before with respect to FIG. 1 and FIG. 5b, is that the spectral domain representation with the second spectral resolution, i.e., the "combined spectral domain representation" is just used for calculating some kind of processing data such as weighting values for a left and a right channel or, stated generally, for a first and a second channel of a multi-channel signal. The processing data generated using the spectral domain representation that has been converted into a high spectral resolution is only used for calculating processing data but this spectral domain representation is not further processed by itself. Instead, using the processing data such as the weighting values, the original input spectral domain representation with the first spectral resolution is spectrally processed as illustrated by block 220. To this end, it is advantageous to use, for example, another spectral domain representation with the first resolution such as for a downmixing operation, for example occurring in the spectral domain.

Figure 8:
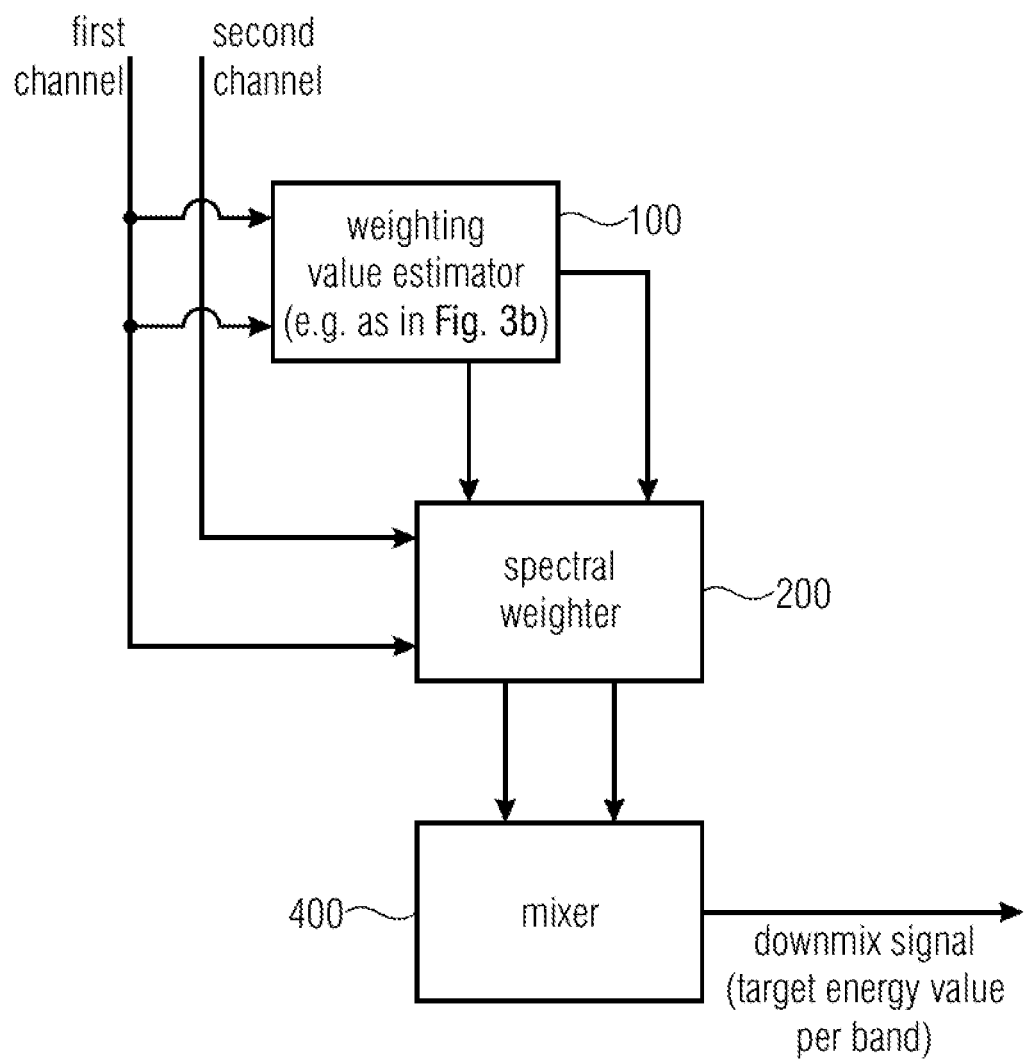
FIG. 8 illustrates an embodiment of the downmixer in accordance with the third aspect.

FIG. 8 illustrates an embodiment of a third aspect of the present invention operating as a downmixer for downmixing a multi-channel signal having at least two channels. The downmixer comprises a weighting value estimator 100 for estimating band-wise weighting values for the at least two channels, where the weighting value estimator is configured to calculate the band-wise weighting values based on the target energy value per band, so that an energy in the band of a downmix signal is in a predetermined relation to energies in the same bands of the at two channels. The weighting value estimator 100 is implemented as illustrated in FIG. 3b and as discussed in the context of FIG. 3b. The downmixer additionally comprises a spectral weighter 200 and a subsequently connected mixer 400 for calculating the downmix signal using the weighted spectral domain representations of the at least two channels.

Figure 9:
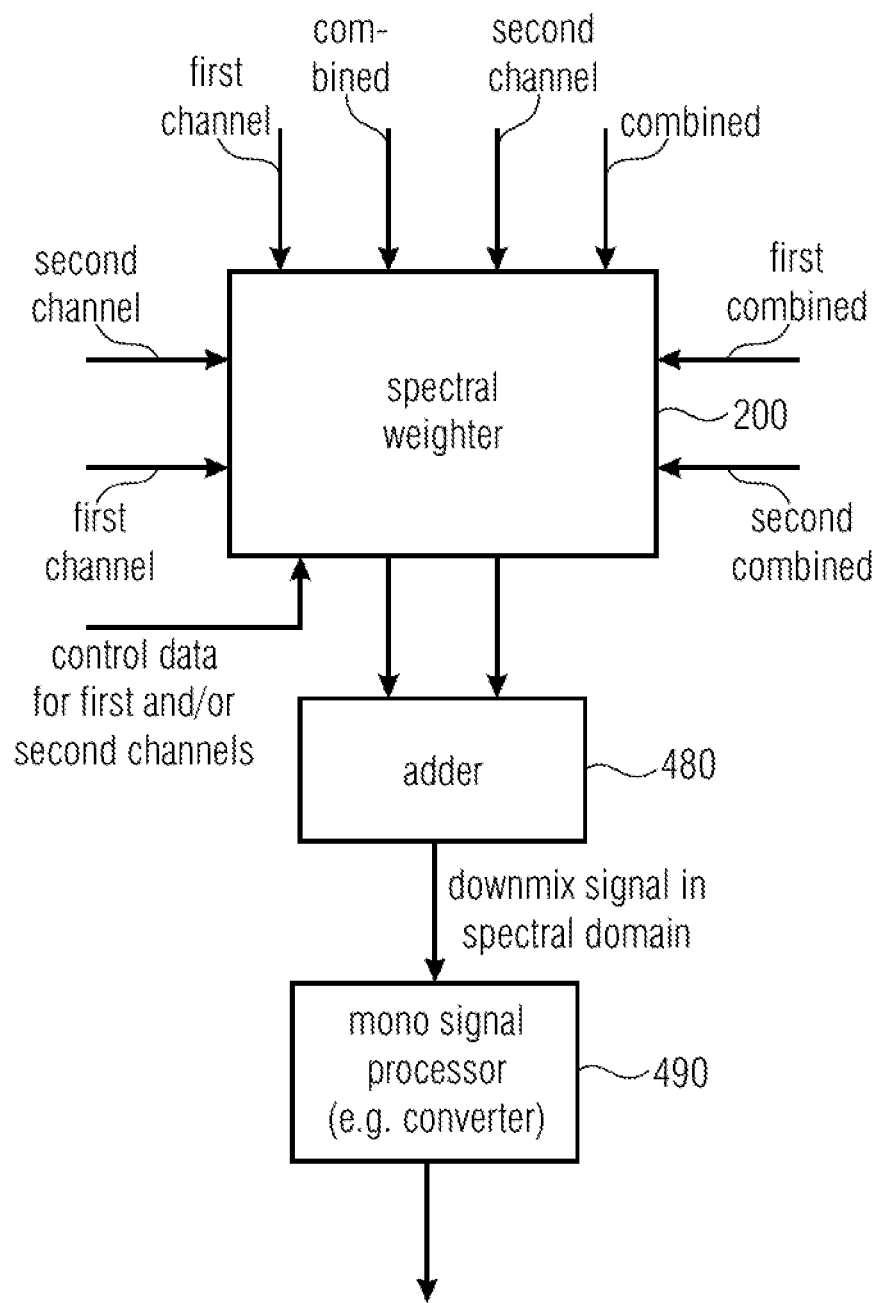
FIG. 9 illustrates a further embodiment of the downmixer in accordance with the third aspect.

FIG. 9 illustrates a further implementation of the FIG. 8 downmixer. The spectral weighter 200 is configured to receive control data for the first and/or the second channel. Furthermore, the spectral weighter is configured to apply the control data for one of four different pairs of input data. The first pair of input data can be the first channel spectral domain representation and the second channel spectral domain representation as illustrated to the left in FIG. 9. The second alternative can be the first channel spectral domain representation and the combined spectral domain representation derived as, for example, discussed with respect to FIG. 5b, 5c. Furthermore, the other alternative can be a pair of data representing the second channel spectral domain representation and a single combined spectral domain representation as also discussed before with respect to FIG. 5b, 5c. Another alternative can be that the spectral weighter 200 applies the spectral weights to a first combined spectral domain representation and a second combined spectral representation as illustrated, with respect to FIG. 5a or 5d. The control data for the first and/or second channels can, for example, be the weighting values $w_L$ on the one hand and $w_R$ on the other hand, but can also be any other control data used for performing any kind of spectral weighting.

A further element of the downmixer is, in an embodiment, an adder 480 that calculates an added spectral domain representation, i.e., a downmix spectral domain representation in the spectral domain. A mono signal processor 490 can be used that is, for example, controlled by any data or that is, for example, implemented as a frequency-time converter as has been discussed before with respect to block 310 of FIG. 1 or FIG. 2.

It is to be emphasized that the three aspects can be used separately from each other but can also be advantageously combined to each other. In particular, the implementation of the weighting value estimator in accordance with FIG. 8 can be applied in the weighting value estimator 100 of the first aspect illustrated in FIG. 1. Furthermore, the spectral resolution converter illustrated in FIG. 6 is implemented by the weighting value estimator 100 of FIG. 1 in the alternative illustrated in FIG. 5b generating a high resolution/low resolution spectral domain representation from two high time resolution and low spectral resolution sub-frames. Furthermore, the functionality of the first aspect illustrated in FIG. 1, particularly with respect to the calculation of processing data, can be implemented by means of the processing data calculator 190 and the further spectral processor 220 illustrated in FIG. 7, and the mixer 400 of the third aspect of the invention can be implemented, as an alternative to FIG. 9, in such a way that the mixer 400 for calculating the downmix signal applies the functionality of the converter 300 illustrated in FIG. 1 before performing the actual time-domain sample-by-sample addition. Thus, all specific embodiments defined in a dependent claim for one of the three aspects can also be applied to any other aspect of the three aspects in the definition of the corresponding dependent claim.

Thus, it becomes clear that depending on the implementation, the three aspects can be applied separately or can be combined to each other either by combining any two of the three aspects or by combining all three aspects.

Subsequently further examples of inventive aspects are given:

1. Downmixer for downmixing a multi-channel signal having at least two channels, comprising:
a weighting value estimator (100) for estimating band-wise weighting values for the at least two channels;
a spectral weighter (200) for weighting spectral domain representations of the at least two channels using the band-wise weighting values;
a converter (300) for converting weighted spectral domain representations of the at least two channels into time representations of the at least two channels; and
a mixer (400) for mixing the time representations of the at least two channels to obtain a downmix signal.

2. Downmixer of example 1, wherein the weighting value estimator (100) is configured to calculate a plurality of first band-wise weighting values for a plurality of bands of a first channel of the at least two channels and to calculate a second plurality of band-wise weighting values for the plurality of bands of a second channel of the at least two channels, or wherein the multi-channel signal has more than two channels and wherein the weighting value estimator (100) is configured to calculate a plurality of first band-wise weighting values for a plurality of bands of a first channel of the more than two channels, to calculate a second plurality of band-wise weighting values for the plurality of bands of a second channel of the more than two channels and to calculate a further plurality of band-wise weighting values for the plurality of bands of a further channel of the more than two channels.

3. Downmixer of example 1 or 2,
wherein the spectral domain representations of the at least two channels each comprise a set of frequency bins, where spectral values are associated with the frequency bins,
wherein the weighting value estimator (100) is configured to calculate the band-wise weighting values for bands, wherein each band comprises one, two or more frequency bins, or wherein a number of frequency bins per band increases with bands having a higher center frequency.

4. Downmixer of one of the preceding examples,
wherein the weighting value estimator (100) is configured to calculate the band-wise weighting values based on a target energy value per band, so that an energy in the band of the downmix signal is in a predetermined relation to energies in the same bands of the at least two channels.

5. Downmixer of one of the preceding examples, further comprising:
a core decoder (500) for decoding an encoded signal, the encoded signal having encoded spectral domain representations of at least two original channels, wherein the core decoder is configured to generate the spectral domain representations from the encoded spectral domain representations.

6. Downmixer of the one the preceding examples,
wherein the spectral domain representations are either purely real or purely imaginary,
wherein the weighting value estimator (100) is configured to estimate (120, 122) an imaginary spectral domain representation when the spectral domain representation is purely real, or to estimate a real spectral domain representation when the spectral domain representation is purely imaginary, and
wherein the weighting value estimator (100) is configured to estimate the band-wise weighting values using the estimated imaginary spectral domain representation or the estimated real spectral domain representation.

7. Downmixer of one of the preceding examples, wherein the weighting value estimator (100) is configured to calculate a first weighting value for a band of a first channel of the at least two channels,
wherein the weighting value estimator (100) is configured to calculate a second weighting value for the band of a second channel of the at least two channels, and
wherein the weighting value estimator (100) is configured to calculate the first weighting value and the second weighting value using an energy of the first channel in the band, an energy of the second channel in the band, and a mixed term depending on a product or a linear combination of spectral values from the at least two channels in the band.

8. Downmixer of one of the preceding examples,
wherein the weighting value estimator (100) is configured to calculate, as the mixed term representing the linear combination, a square root of an energy of spectral values added to each other in the band from the spectral domain representations of the at least two channels, wherein the band comprises a plurality of spectral values, or to calculate, as the mixed term representing the product, an absolute value of a complex dot product between the spectral values in the band of a first channel and the spectral values in the band of a second channel of the at least two channels.

9. Downmixer of one of the preceding examples,
wherein each band of a first and a second channel of the plurality of at least two channels has a plurality of spectral values, wherein the spectral weighter (200) is configured to apply the same weight to each spectral value in the band of one of the at least two channels, and to apply another weight to each spectral value in the band of another channel of the at least two channels.

10. Downmixer of one of the preceding examples,
wherein the weighted spectral domain representations are MDCT (modified discrete cosine transform) spectra, and
wherein the converter (300) is configured to perform, for each channel of the plurality of channels, an inverse MDCT transform using a synthesis windowing operation and an overlap-add operation.

11. Downmixer of one of the preceding examples,
wherein the mixer (400) is configured to apply a sample-by-sample addition of the time representations of the at least two channels, or
wherein the mixer (400) is configured to apply a sample-by-sample addition of the time representations of the at least two channels and a scaling operation applied to a result of the sample-by-sample addition or applied to inputs into the sample-by-sample addition.

12. Downmixer of one of the preceding examples,
wherein the converter (300) is configured to generate (310) raw time representations using a spectrum-time algorithm, and
to post process (320) the raw time representations individually, in signal processing direction before the mixing by the mixer (400), using separate control information for the channels to obtain the time representations.

13. Downmixer of example 12,
wherein the converter (300) is configured to perform, as the post processing (320), a bass post-filtering, a TCX-LTP (Transform Coded Excitation Long Term Prediction) processing or an LPC (Linear Prediction Coding) synthesis individually for each time representation.

14. Downmixer of one of the preceding examples,
wherein a first spectral domain representation of a first channel of the at least two channels has a first time or frequency resolution,
wherein a second spectral domain representation of a second channel of the at least two channels has a second time or frequency resolution, wherein the second time or frequency resolution is different from the first time or frequency resolution, and
wherein the weighting value estimator (100) is configured to calculate the band-wise weighting values so that a frequency resolution of the bands associated with the band-wise weighting values is lower than the first frequency resolution and the second frequency resolution or is equal to the lower one of the first and the second frequency resolution.

15. Downmixer of one of the preceding examples,
wherein the first spectral domain representation has a first plurality of spectral values in a band,
wherein the second spectral domain representation has a second plurality of spectral values in the band, the second plurality being higher than the first plurality, and
wherein the weighting value estimator (100) is configured to combine two or more spectral values of the second plurality of spectral values or to select, from the second plurality of spectral values, a subset of spectral values,
to calculate a mixed term depending on products or linear combinations of spectral values from the at least two channels in the band using a result of combining the two or more spectral values or using the subset of spectral values, and
to calculate the band-wise weighting values using the mixed term.

16. Downmixer in accordance with one of the preceding examples,
wherein a first spectral domain representation comprises a plurality of first spectral values representing a first time bin size and a first frequency bin size,
wherein the second spectral domain representation comprises a plurality of spectral values representing a second time bin size and a second frequency bin size,
wherein the first time bin size is greater than the second time bin size, or wherein the first frequency bin size is lower than the second frequency bin size,
wherein the weighting value estimator (100) is configured to combine a plurality of spectral values from the first spectral domain representation to obtain a first combined spectral domain representation in which a combined frequency bin size is equal to the second frequency bin size, or to combine a plurality of spectral values from the second spectral domain representation to obtain a first combined spectral domain representation in which a combined time bin size is equal to the first time bin size.

17. Downmixer of example 16,
wherein the weighting value estimator (100) is configured to use the first combined spectral representation or the second combined spectral domain representation for the calculation of the band-wise weighting values for a first channel and a second channel of the at least two channels, the calculation comprising a calculation of a mixed term in bands and a calculation of energies in the bands, and
wherein the spectral weighter (200) is configured to apply the band-wise weighting values for the first channel of the at least two channels to spectral values of the first spectral domain representation in corresponding bands and to apply the band-wise weighting values for the second channel of the at least two channels to spectral values of the second spectral domain representation in the corresponding bands.

18. Downmixer in accordance with one of the examples 1 to 15,
wherein a first spectral domain representation of a first channel comprises a plurality of first spectral values representing a first time bin size and a first frequency bin size,
wherein a second spectral domain representation of a second channel comprises at least two subframes, wherein each subframe comprises a plurality of spectral values representing a second time bin size and a second frequency bin size,
wherein the first time bin size is greater than the second time bin size, or wherein the first frequency bin size is lower than the second frequency bin size,
wherein the weighting value estimator (100) is configured to combine spectral values belonging to the same frequency bin from each subframe of the second spectral domain representation in a first manner to obtain a first group of combined spectral values, and
to combine spectral values belonging to the same frequency bin from each subframe of the second spectral domain representation in a second manner to obtain a second group of combined spectral values, the second manner being different from the first manner,
wherein the first group of combined spectral values and the second group of combined spectral values represent a combined spectral domain representation having the first time bin size and the first frequency bin size, and
to use the spectral values of the combined spectral domain representation and the first spectral domain representation for the calculation of the band-wise weighting values.

19. Downmixer in accordance with example 18,
wherein the weighting value estimator (100) is configured to perform one of an addition and a subtraction in the first manner and the other of the addition and the subtraction in the second manner.

20. Downmixer in accordance with example 18 or 19,
wherein the weighting value estimator (100) is configured to perform an average function in the first manner and in the second manner.

21. Downmixer in accordance with one of examples 18 to 20, wherein the weighting value estimator (100) is configured to apply either the first manner or the second manner comprising a weighting using a weighting sign, wherein the weighting value estimator (100) is configured to set the weighting sign in accordance with a frequency bin number of the same frequency bin.

21. Downmixer in accordance with one of examples 18 to 21, wherein the weighting value estimator (100) is configured to apply, as the first manner, one of a high pass filtering and a low pass filtering, and as the second manner, the other one of a high pass filtering and a low pass filtering.

22. Downmixer in accordance with one of examples 18 to 22, wherein the weighting value estimator (100) is configured to transform a lower resolution bin into two higher resolution bins, wherein the first manner is used for an even bin number of a first higher resolution bin of the two higher resolution bins and the second manner is used for an odd bin number of a second higher resolution bin of the two higher resolution bins.

23. Downmixer in accordance with one of examples 18 to 22,
wherein the first spectral domain representation of the first channel comprises a TCX20 frame, wherein the second spectral domain representation of the second channel comprises two TCX10 subframes, wherein the weighting value estimator (100) is configured to calculate a combined TCX20 spectral domain representation from the two TCX10 subframes, or
wherein the first spectral domain representation of the first channel comprises a TCX20 frame, wherein the second spectral domain representation of the second channel comprises a TCX10 subframe and two TCX5 subframes, wherein the weighting value estimator (100) is configured to calculate a first combined TCX10 spectral domain representation from the two TCX5 subframes and to calculate a second combined TCX20 subframe from the first combined TCX10 spectral domain representation and the TCX10 subframe, or
wherein the first spectral domain representation of the first channel comprises a TCX10 subframe, wherein the second spectral domain representation of the second channel comprises two TCX5 subframes, and wherein the weighting value estimator (100) is configured to calculate a combined TCX10 spectral domain representation from the two TCX5 subframes,
wherein the expression TCX20 indicates a first portion with a first time length, wherein the expression TCX10 indicates a second portion with a second time length, and wherein the expression TCX5 indicates a third portion with a third time length, wherein the first time length is longer than the second time length or the third time length, or wherein the second time length is shorter than the first time length or longer than the second time length, and wherein the third time length is shorter than the first time length or shorter than the second time length.

24. Downmixer in accordance with one of examples 18 to 23, wherein the weighting value estimator (100) is configured to apply the first manner based on the following equation:

$$MDCT_{2i,k0} = \frac{1}{2}(MDCT_{i,k1} + (-1)^i MDCT_{i,k0}), \text{ or}$$

wherein the weighting value estimator (100) is configured to apply the second manner based on the following equation:

$$MDCT_{2i+1,k0} = (MDCT_{i,k1} - (-1)^i MDCT_{i,k0}),$$

wherein i specifies a spectral bin number and k0 and k1 specify subframes of the second spectral domain representation of the second channel, and
wherein $MDCT_{2i,k0}$ and $MDCT_{2i+1,k0}$ indicate spectral values of the combined spectral domain representation and $MDCT_{i,k1}$ and $MDCT_{i,k0}$ indicate spectral values from a second subframe $k_1$ and a first subframe $k_0$, respectively.

25. Downmixer in accordance with example 1,
wherein a first spectral domain representation of a first channel of the at least two channels has a first time resolution or a first frequency resolution, wherein a second spectral domain representation of a second channel of the at least two channels has a second time resolution or a second frequency resolution, wherein the second time resolution is different from the first time resolution or wherein the second frequency resolution is different from the first frequency resolution, and
wherein the weighting value estimator (100) is configured to convert (132) the first spectral domain representation into a combined spectral domain representation having the second time resolution or the second frequency resolution, and to calculate the band-wise weighting values using the combined spectral domain representation and the second spectral domain representation, or to convert the second spectral domain representation into a combined spectral domain representation having the first time resolution or the first frequency resolution, and to calculate the band-wise weighting values using the combined spectral domain representation and the first spectral domain representation, or
wherein a first spectral domain representation of a first channel of the at least two channels has a first time resolution or a first frequency resolution, wherein a second spectral domain representation of a second channel of the at least two channels has a second time resolution or a second frequency resolution, wherein the second time resolution is different from the first time resolution or wherein the second frequency resolution is different from the first frequency resolution and
wherein the weighting value estimator (100) is configured to convert (132) the first spectral domain representation into a first combined spectral domain representation having a third time resolution or a third frequency resolution,
wherein the third time resolution is different from the first time resolution or the second time resolution and wherein the third frequency resolution is different from the first frequency resolution or the second frequency resolution,
to convert (132) the second spectral domain representation into a second combined spectral domain representation having the third time resolution or the third frequency resolution, and
to calculate (134) the band-wise weighting values using the first combined spectral domain representation and the second combined spectral domain representation.

26. Downmixer in accordance with example 25,
wherein the second channel comprises, for a specific time portion (TCX20), the second spectral domain representation,
wherein the first channel comprises, for the specific time portion (2×TCX10), two or more of the first spectral domain representations,
wherein the weighting value estimator (100) is configured to convert the two or more first spectral domain representations into the combined spectral domain representation having the same time and frequency resolution as the second spectral domain representation, and to calculate the band-wise weighting values using the combined spectral domain representation and the second spectral domain representation, and
wherein the spectral weighter (200) is configured to weight the second spectral domain representation using the band-wise weighting values, and to weight each first spectral domain representation of the two or more first spectral domain representations using the same band-wise weighting values.

27. Downmixer in accordance with example 26,
wherein the weighting value estimator (100) is configured, for adding spectral values for a same frequency of the two or more first spectral domain representations to obtain a first spectral value of the combined spectral domain representation, and for subtracting spectral values for a same frequency of the two or more first spectral domain representations to obtain a second spectral value of the combined spectral domain representation being higher and adjacent in frequency to the first spectral value of the combined spectral domain representation, and
wherein the spectral weighter (200) is configured to weight a band having same frequencies in each first spectral domain representation of the two or more first spectral domain representations using the same band-wise weighting value.

28. Downmixer in accordance with example 25,
wherein the second channel comprises, for a specific time portion (TCX20), the second spectral domain representation,
wherein the first channel comprises, for the specific time portion (2×TCX10), two or more first spectral domain representations,
wherein the weighting value estimator (100) is configured
to convert the second spectral domain representation into two or more combined spectral domain representations having the same time and frequency resolution as the two or more first spectral domain representations,
to calculate first band-wise weighting values using a first combined spectral domain representation of the two or more combined spectral domain representations and a first first spectral domain representation of the two or more first spectral domain representations,
to calculate second band-wise weighting values using a second combined spectral domain representation of the two or more combined spectral domain representations and a second first spectral domain representation of the two or more first spectral domain representations, and
wherein the spectral weighter (200) is configured
to weight the second spectral domain representation using derived band-wise weighting values derived (136) from the first and second band-wise weighting values,
to weight the first first spectral domain representation of the two or more first spectral domain representations using the first band-wise weighting values and
to weight the second first spectral domain representation of the two or more first spectral domain representations using the second band-wise weighting values.

29. Downmixer in accordance with example 28,
wherein the weighting value estimator (100) is configured, for adding spectral values for pairs of frequencies of the second spectral domain representation to obtain an added spectral value and for copying to added spectral value to obtain a combined spectral value for each of the two or more combined spectral domain representations, and wherein the spectral weighter (200) is configured to combine (136) a weighting value for a specific band of the first band-wise weighting values with a weighting value for the specific band of the second band-wise weighting values to obtain a derived weighting value for the specific band of the derived band-wise weighting values.

30. Downmixer in accordance with example 25, wherein the second channel comprises, for a specific time portion (TCX20), the second spectral domain representation, wherein the first channel comprises, for the specific time portion (2×TCX10), two or more first spectral domain representations, wherein the weighting value estimator (100) is configured to convert the second spectral domain representation into two or more combined spectral domain representations having the same time resolution as the two or more first spectral domain representations, and having the same frequency resolution as the second spectral domain representation, to calculate first band-wise weighting values using a first combined spectral domain representation of the two or more combined spectral domain representations and a first first spectral domain representation of the two or more first spectral domain representations, to calculate second band-wise weighting values using a second combined spectral domain representation of the two or more combined spectral domain representations and a second first spectral domain representation of the two or more first spectral domain representations, and wherein the spectral weighter (200) is configured to weight the second spectral domain representation using band-wise weighting values derived (136) from the first and second band-wise weighting values, to weight the first first spectral domain representation of the two or more first spectral domain representations using the first band-wise weighting values, and to weight the second first spectral domain representation of the two or more first spectral domain representations using the second band-wise weighting values.

31. Downmixer in accordance with example 30, wherein the weighting value estimator (100) is configured for upsampling one or more spectral values to obtain a upsampled spectral values for adjacent frequencies of the second spectral domain representation and for copying to upsampled spectral values to obtain combined spectral values for each of the two or more combined spectral domain representations, and wherein the spectral weighter (200) is configured to combine (136) a weighting value for a specific band of the first band-wise weighting values with a weighting value for the specific band of the second band-wise weighting values to obtain a derived weighting value for the specific band of the derived band-wise weighting values.

32. Downmixer in accordance with example 25, wherein the second channel comprises, for a specific time portion (TCX20), the second spectral domain representation, wherein the first channel comprises, for the specific time portion (2×TCX10), two or more of the first spectral domain representations, wherein the weighting value estimator (100) is configured to convert the two or more first spectral domain representations into the first combined spectral domain representation having the same time resolution as the second spectral domain representation, to convert the second spectral domain representations into the second combined spectral domain representation having the same frequency resolution as the two or more first spectral domain representation, and to calculate the band-wise weighting values using the first combined spectral domain representation and the second combined spectral domain representation, and wherein the spectral weighter (200) is configured to weight the second spectral domain representation using the band-wise weighting values, and to weight each first spectral domain representation of the two or more first spectral domain representations using the same band-wise weighting values.

33. Downmixer in accordance with example 32, wherein the weighting value estimator (100) is configured for adding spectral values for pairs of frequencies of the second spectral domain representation to obtain the second combined spectral domain representation, and for adding spectral values of the same frequency of the two or more of the first spectral domain representations to obtain the first combined spectral domain representation, and wherein the spectral weighter (200) is configured to weight a band having same frequencies in each first spectral domain representation of the two or more first spectral domain representations using the same band-wise weighting value.

34. Downmixer in accordance with one of the preceding examples, wherein the weighting value estimator (100) is configured to calculate a plurality of first band-wise weighting values for a plurality of bands of a first channel of the at least two channels using a first calculation rule depending on at least two of spectral values of a first spectral domain representation of the first channel, spectral values of a second spectral domain representation of the second channel, spectral values of a single combined spectral domain representation derived from the spectral values of the first spectral domain representation or the second spectral domain representation, spectral values of a first combined spectral domain representation derived from the spectral values of the first spectral domain representation, and spectral values of a second combined spectral domain representation derived from the spectral values of the second spectral domain representation, and wherein the weighting value estimator (100) is configured to calculate a plurality of second band-wise weighting values for a plurality of bands of the first channel of the at least two channels using a second calculation rule depending on at least two of the plurality of first band-wise weighting values, the spectral values of the first spectral domain representation of the first channel, the spectral values of the second spectral domain representation of the second channel, the spectral values of the single combined spectral domain representation derived from the spectral values of the first spectral domain representation or the second spectral domain representation, the spectral values of a first combined spectral domain representation derived from the spectral values of the first spectral domain representation, and the spectral values of a second combined spectral domain representation derived from the spectral values of the second spectral domain representation, wherein the second calculation rule is different from the first calculation rule.

35. Apparatus for converting a spectral resolution of a spectral domain representation of a channel comprising at least two subframes, wherein each subframe comprises a plurality of spectral values representing a time bin size and a frequency bin size, comprising:

a spectral value calculator (160) for combining (170) spectral values belonging to the same frequency bin from each subframe of the spectral domain representation in a first manner to obtain a first group of combined spectral values, and for combining (180) spectral values belonging to the same frequency bin from each subframe of the spectral domain representation in a second manner to obtain a second group of combined spectral values, the second manner being different from the first manner, wherein the first group of combined spectral values and the second group of combined spectral values represent a combined spectral domain representation having a different time bin size and a different frequency bin size.

36. Apparatus in accordance with example 35, wherein the spectral value calculator (160) is configured to perform one of an addition and a subtraction in the first manner and the other of the addition and the subtraction in the second manner.

37. Apparatus in accordance with example 35 or 36, wherein the spectral value calculator (160) is configured to perform an average function in the first manner and in the second manner.

38. Apparatus in accordance with one of examples 35 to 37, wherein the spectral value calculator (160) is configured to apply either the first manner or the second manner comprising a weighting using a weighting sign, wherein the spectral value calculator (160) is configured to set the weighting sign in accordance with a frequency bin number of the same frequency bin.

39. Apparatus in accordance with one of examples 35 to 38, wherein the spectral value calculator (160) is configured to apply, as the first manner, one of a high pass filtering and a low pass filtering, and as the second manner, the other one of a high pass filtering and a low pass filtering.

40. Apparatus in accordance with one of examples 35 to 39, wherein the spectral value calculator (160) is configured to transform a lower resolution bin into two higher resolution bins wherein the first manner is used for an even bin number and the second manner is used for an odd bin number.

41. Apparatus in accordance with one of examples 35 to 40, wherein the first spectral domain representation of the first channel comprises a TCX20 frame, wherein the spectral domain representation of the channel comprises two TCX10 subframes, wherein the spectral value calculator is configured to calculate a combined TCX20 spectral domain representation from the two TCX10 subframes, or wherein the first spectral domain representation of the first channel comprises a TCX20 frame, wherein the spectral domain representation of the channel comprises a TCX10 subframe and two TCX5 subframes, wherein the spectral value calculator (160) is configured to calculate a first combined TCX10 spectral domain representation from the two TCX5 subframes and to calculate a second combined TCX20 subframe from the first combined TCX10 spectral domain representation and the TCX10 subframe, or wherein the first spectral domain representation of the first channel comprises a TCX10 subframe, wherein the spectral domain representation of the channel comprises two TCX5 subframes, and wherein the spectral value calculator (160) is configured to calculate a combined TCX10 spectral domain representation from the two TCX5 subframes, wherein the expression TCX20 indicates a first portion with a first time length, wherein the expression TCX10 indicates a second portion with a second time length, and wherein the expression TCX5 indicates a third portion with a third time length, wherein the first time length is longer than the second time length or the third time length, or wherein the second time length is shorter than the first time length or longer than the second time length, and wherein the third time length is shorter than the first time length or shorter than the second time length.

42. Apparatus in accordance with one of examples 35 to 41, wherein the spectral value calculator (160) is configured to apply the first manner based on the following equation:

$$MDCT_{2i,k0} = \tfrac{1}{2}(MDCT_{i,k1} + (-1)^i MDCT_{i,k0}), \text{ or}$$

wherein the spectral value calculator is configured to apply the second manner based on the following equation:

$$MDCT_{2i+1,k0} = \tfrac{1}{2}(MDCT_{i,k1} - (-1)^i MDCT_{i,k0}),$$

wherein i specifies a spectral bin number and k0 and k1 subframes of the spectral domain representation of the channel, and wherein $MDCT_{2i,k0}$ and $MDCT_{2i+1,k0}$ indicate spectral values of the combined spectral domain representation and $MDCT_{i,k1}$ and $MDCT_{i,k0}$ indicate spectral values from a second subframe $k_1$ and a first subframe $k_0$, respectively.

43. Apparatus in accordance with one of examples 35 to 42, further comprising a signal calculator (500, 190, 220) for using the combined spectral domain representation having a different time bin size and a different frequency bin size in a calculation of an encoded or decoded or processed audio signal.

44. Apparatus in accordance with any one of examples 35 to 43, wherein the spectral value calculator (160) is configured to receive the spectral domain representation with a first spectral resolution and to generate a converted spectral domain representation with a second spectral resolution being different from the first spectral resolution, wherein the apparatus further comprises:

a first spectral processor (500) for processing the converted spectral domain representation to obtain a processed spectral domain representation with the second resolution, or a processing data calculator (190) for calculating processing data from the converted spectral domain representation, and a second spectral processor (220) for processing the spectral domain representation to obtain a processed spectral domain representation with the first resolution.

45. Apparatus in accordance with example 44, wherein the first spectral processor (500) is configured to use, in the processing, a further spectral domain representation having the second spectral resolution, or wherein the second spectral processor (220) is configured to use, in the processing, a further spectral domain representation having the first spectral resolution.

46. Downmixer for downmixing a multi-channel signal having at least two channels, comprising:

a weighting value estimator (100) for estimating band-wise weighting values for the at least two channels, wherein the weighting value estimator (100) is configured to calculate the band-wise weighting values based on a target energy value per band, so that an energy in the band of a downmix signal is in a predetermined relation to energies in the same bands of the at least two channels;

a spectral weighter (200) for weighting spectral domain representations of the at least two channels using the band-wise weighting values to obtain weighted spectral domain representations; and a mixer (400) for calculating the downmix signal using the weighted spectral domain representations of the at least two channels.

47. Downmixer of the example 46,
wherein the spectral domain representations are either purely real or purely imaginary,
wherein the weighting value estimator (100) is configured to estimate (140) an imaginary spectral domain representation when the spectral domain representation is purely real, or to estimate (140) a real spectral domain representation when the spectral domain representation is purely imaginary, and wherein the weighting value estimator (100) is configured to estimate the band-wise weighting values using the estimated imaginary spectral domain representation or the estimated real spectral domain representation.

48. Downmixer of one of the examples 46 or 47, wherein the weighting value estimator (100) is configured to calculate a first weighting value for a band of a first channel of the at least two channels, to calculate a second weighting value for the band of a second channel of the at least two channels, and to calculate the first weighting value and the second weighting value using (142) an energy of the first channel in the band, an energy of the second channel in the band, and a mixed term depending on a product (148) or a linear combination (146) of spectral values from the at least two channels in the band.

49. Downmixer of one of the examples 46 to 48,
wherein the weighting value estimator (100) is configured to calculate, as the mixed term representing the linear combination (146), a square root of an energy of spectral values added to each other in the band from the spectral domain representations of the at least two channels, wherein the band comprises a plurality of spectral values, or to calculate, as the mixed term representing the product (148), an absolute value of a complex dot product between the spectral values in the band of a first channel and the spectral values in the band of a second channel of the at least two channels.

50. Downmixer of one of the examples 46 to 49,
wherein each band of a first and a second channel of the at least two channels has a plurality of spectral values, wherein the spectral weighter (200) is configured to apply the same weight to each spectral value in the band of one of the at least two channels, and to apply another weight to each spectral value in the band of another channel of the at least two channels.

51. Downmixer of one of the examples 46 to 50, wherein the weighting value estimator (100) is configured to calculate (150) the band-wise weighting values for a first channel of the at least two channels based on the following equation:

$$w_R = \frac{1}{2\sqrt{2}} \frac{\sqrt{|L|^2 + |R|^2 + 2|\langle L, R\rangle|}}{|L| + |R|}$$

wherein $w_R$ is a weighting factor for the first channel for a band, wherein $|L|^2$ is an estimated power for, the second channel, wherein $|R|^2$ is an estimated power for the first channel in the band, wherein $2|\langle L, R\rangle|$ is an estimated dot product between the channels in the band, wherein $|L|$ is an estimated amplitude for the second channel in the band, wherein $|R|$ is an estimated amplitude for the first channel in the band.

52. Downmixer of example 51, wherein the weighting value estimator (100) is configured to calculate (152) the band-wise weighting values for a second channel of the at least two channels based on the following equation:

$$w_L = w_R + 1 - \frac{|L + R|}{|L| + |R|},$$

wherein $w_L$ is a weighting factor for the second channel for the band, and wherein $|L+R|$ is an estimated linear combination of the estimated amplitudes for the first channel and the second channel in the band.

53. Downmixer of one of examples 50 to 52, wherein the weighting value estimator (100) is configured to calculate (144) the estimated amplitude for the second channel in the band, and to calculate the estimated amplitude for the first channel in the band based on the following equations:

$$|L| = \sqrt{\Sigma_{i\,in\,b}(MDCT_{i,l}^2 + MDST_{i,l}^2)},\ |R| = \sqrt{\Sigma_{i\,in\,b}(MDCT_{i,r}^2 + MDST_{i,r}^2)},\text{ or}$$

wherein the weighting value estimator (100) is configured to calculate (146) the estimated linear combination of the estimated amplitudes for the first channel and the second channel in the band based on the following equation:

$$|L + R| = \sqrt{|L|^2 + |R|^2 + 2(\Sigma_{i\,in\,b}(MDCT_{i,l}MDCT_{i,r} + MDST_{i,l}MDST_{i,r}))^2},$$

or
wherein the weighting value estimator (100) is configured to calculate (148) the estimated dot product between the channels in the band based on the following equation:

$$|\langle L, R\rangle| = \sqrt{\begin{array}{l}(\Sigma_{i\,in\,b}(MDCT_{i,l}MDCT_{i,r} + MDST_{i,l}MDST_{i,r}))^2 + \\ (\Sigma_{i\,in\,b}(MDST_{i,l}MDCT_{i,r} - MDCT_{i,l}MDST_{i,r}))^2\end{array}},$$

or
wherein the weighting value estimator (100) is configured to calculate (142) the estimated power for the second channel in the band or the estimated power for the first channel in the band based on the following equation:

$$|L|^2 = \sum_{i\,in\,b}(MDCT_{i,l}^2 + MDST_{i,l}^2),\ |R|^2 = \sum_{i\,in\,b}(MDCT_{i,r}^2 + MDST_{i,r}^2)$$

wherein i specifies the bin number inside spectral band b, and wherein $MDST_L$ represents an estimated imaginary part of an MDCT bin i, wherein $MDCT_L$ represents the real part of the MDCT bin i included in the spectral domain representation of the first or the second channel, wherein r represents the first channel, and wherein l represents the second channel.

54. Downmixer of one of the examples 46 to 53,
wherein a first spectral domain representation of a first channel of the at least two channels has a first time resolution or a first frequency resolution, wherein a second spectral domain representation of a second channel of the at least two channels has a second time resolution or a second frequency resolution, wherein the second time resolution is different from the first time resolution and wherein the second frequency resolution is different from the first frequency resolution (130), and
wherein the weighting value estimator (100) is configured to convert (132) the first spectral domain representation into a combined spectral domain representation having the second time resolution or the second frequency resolution, and to calculate the band-wise weighting values (134) using the combined spectral domain representation and the second spectral domain representation, or to convert (132) the second spectral domain representation into a combined spectral domain representation having the first time resolution or the first frequency resolution, and to calculate (134) the band-wise weighting values using the combined spectral domain representation and the first spectral domain representation, or wherein a first spectral domain representation of a first channel of the at least two channels has a first time resolution or a first frequency resolution, wherein a second spectral domain representation of a second channel of the at least two channels has a second time resolution or a second frequency resolution, wherein the second time resolution is different from the first time resolution and wherein the second frequency resolution is different from the first frequency resolution (130), and wherein the weighting value estimator (100) is configured to convert (132) the first spectral domain representation into a first combined spectral domain representation having a third time resolution or a third frequency resolution, wherein the third time resolution is different from the first time resolution or the second time resolution and wherein the third frequency resolution is different from the first frequency resolution or the second frequency resolution, to convert (132) the second spectral domain representation into a second combined spectral domain representation having the third time resolution or the third frequency resolution, and to calculate (134) the band-wise weighting values using the first combined spectral domain representation and the second combined spectral domain representation.

55. Downmixer of example 54, wherein the spectral weighter (200) is configured for weighting, as the spectral domain representations of the at least two channels, one of the combined spectral domain representation and the second spectral domain representation, the combined spectral domain representation and the first spectral domain representation, and the first combined spectral domain representation and the second combined spectral domain representation to obtain a first weighted spectral domain representation and a second weighted spectral domain representation.

56. Downmixer of example 55, wherein the mixer (400) is configured for adding the first and second weighted spectral domain representations to obtain a spectral domain downmix representation and for converting the spectral domain downmix representation in the time domain to obtain the downmix signal or for converting the first and second weighted spectral domain representations into the time domain to obtain time representations of the at least two channels and for adding the time representations of the at least two channels to obtain the downmix signal.

57. Method for downmixing a multi-channel signal having at least two channels, comprising:
estimating band-wise weighting values for the at least two channels;
weighting spectral domain representations of the at least two channels using the band-wise weighting values;
converting weighted spectral domain representations of the at least two channels into time representations of the at least two channels; and
mixing the time representations of the at least two channels to obtain a downmix signal.

58. Method for converting a spectral resolution of a spectral domain representation of a channel comprising at least two subframes, wherein each subframe comprises a plurality of spectral values representing a time bin size and a frequency bin size, comprising:
combining spectral values belonging to the same frequency bin from each subframe of the spectral domain representation in a first manner to obtain a first group of combined spectral values; and
combining spectral values belonging to the same frequency bin from each subframe of the spectral domain representation in a second manner to obtain a second group of combined spectral values, the second manner being different from the first manner,
wherein the first group of combined spectral values and the second group of combined spectral values represent a combined spectral domain representation having a different time bin size and a different frequency bin size.

59. Method of downmixing a multi-channel signal having at least two channels, comprising:
estimating band-wise weighting values for the at least two channels, comprising calculating the band-wise weighting values based on a target energy value per band, so that an energy in the band of a downmix signal is in a predetermined relation to energies in the same bands of the at least two channels;
weighting spectral domain representations of the at least two channels using the band-wise weighting values to obtain weighted spectral domain representations; and calculating the downmix signal using the weighted spectral domain representations of the at least two channels.

60. Computer program for performing, when running a computer or processor, the method of example 57 or 58 or 59.

It is to be mentioned here that all alternatives or aspects as discussed before and all aspects as defined by independent claims in the following claims can be used individually, i.e., without any other alternative or object than the contemplated alternative, object or independent claim. However, in other embodiments, two or more of the alternatives or the aspects or the independent claims can be combined with each other and, in other embodiments, all aspects, or alternatives and all independent claims can be combined to each other.

An inventively encoded audio signal can be stored on a digital storage medium or a non-transitory storage medium or can be transmitted on a transmission medium such as a wireless transmission medium or a wired transmission medium such as the Internet.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Depending on certain implementation requirements, embodiments of the invention can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier or a non-transitory storage medium.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

While this invention has been described in terms of several advantageous embodiments, there are alterations, permutations, and equivalents, which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCES

[1] ITU-R BS.775-2, *Multichannel Stereophonic Sound System With And Without Accompanying Picture*, July 2006.

[2] F. Baumgarte, C. Faller und P. Kroon, "Audio Coder Enhancement using Scalable Binaural Cue Coding with Equalized Mixing," in 116*th Convention of the AES*, Berlin, 2004.

[3] G. Stoll, J. Groh, M. Link, J. Deigmöller, B. Runow, M. Keil, R. Stoll, M. Stoll and C. Stoll, "Method for Generating a Downward-Compatible Sound Format". USA Patent US 2012/0 014 526, 2012.

[4] M. Kim, E. Oh and H. Shim, "Stereo audio coding improved by phase parameters," in 129*th Convention of the AES*, San Francisco, 2010.

[5] A. Adami, E. Habets and J. Herre, "Down-mixing using coherence suppression," in *IEEE International Conference on Acoustics, Speech and Signal Processing*, Florence, 2014.

[6] ISO/IEC 23008-3: *Information technology—High efficiency coding and media delivery in heterogeneous environments—Part 3: 3D audio*, 2019.

[7] S. Bayer, C. Borß, J. Bathe, S. Disch, B. Edler, G. Fuchs, F. Ghido and M. Multrus, "DOWNMIXER AND METHOD FOR DOWNMIXING AT LEAST TWO CHANNELS AND MULTICHANNEL ENCODER AND MULTICHANNEL DECODER". WO2018086946.

[8] 3GPP TS 26.445, *Codec for Enhanced Voice Services (EVS); Detailed algorithmic description.*

[9] S. Chen, H. Ruimin and S. Zhang, "Estimating spatial cues for audio coding in MDCT domain," in *IEEE International Conference on Multimedia and Expo*, New York, 2009.

The invention claimed is:

1. A downmixer for downmixing a multi-channel audio signal having at least two audio channels, comprising:
  a weighting value estimator configured for estimating band-wise weighting values for the at least two audio channels;
  a spectral weighter configured for weighting spectral domain representations of the at least two audio channels using the band-wise weighting values;
  a converter configured for converting weighted spectral domain representations of the at least two audio channels into time representations of the at least two audio channels, wherein the converter is configured to generate raw time representations using a spectrum-time algorithm, and to post process, using a post-processor, the raw time representations to acquire the time representations; and
  a mixer configured for mixing the time representations of the at least two audio channels to acquire a downmix audio signal,
  wherein the spectral domain representations are either purely real or purely imaginary, wherein the weighting value estimator is configured to obtain an estimated imaginary spectral domain representation when a spectral domain representation of the spectral domain representations is purely real, or to obtain an estimated real spectral domain representation when the spectral domain representation of the spectral domain representations is purely imaginary, and wherein the weighting value estimator is configured to estimate the band-wise weighting values using the estimated imaginary spectral domain representation or the estimated real spectral domain representation, or
  wherein a first spectral domain representation of a first audio channel of the at least two audio channels comprises a first time resolution or a first frequency resolution, wherein a second spectral domain representation of a second audio channel of the at least two audio channels comprises a second time resolution or a second frequency resolution, wherein the second time resolution or the second frequency resolution is different from the first time resolution or the first frequency resolution, and wherein the weighting value estimator is configured to calculate the band-wise weighting values so that a frequency resolution of a plurality of bands associated with the band-wise weighting values is lower than the first frequency resolution and the second frequency resolution or is equal to the lower one of the first frequency resolution and the second frequency resolution, or wherein the first spectral domain representation comprises a first plurality of spectral values in a band, wherein the second spectral domain representation comprises a second plurality of spectral values in the band, the second plurality of spectral values being higher than the first plurality of spectral values, and wherein the weighting value estimator is configured to combine two or more spectral values of the second plurality of spectral values or to select, from the second plurality of spectral values, a subset of spectral values, to calculate a mixed term depending on products or linear combinations of spectral values from the at least two audio channels in the band using a result of combining the two or more spectral values of the second plurality of spectral values or using the subset of spectral values, and to calculate the band-wise weighting values using the mixed term, or wherein the first spectral domain representation of the spectral domain representations comprises a plurality of first spectral values representing a first time bin size and a first frequency bin size, wherein the second spectral domain representation of the spectral domain representations comprises a plurality of spectral values representing a second time bin size and a second frequency bin size, wherein the first time bin size is greater than the second time bin size, or wherein the first frequency bin size is lower than the second frequency bin size, and wherein the weighting value estimator is configured to combine a plurality of spectral values from the first spectral domain representation to acquire a first combined spectral domain representation in which a combined frequency bin size is equal to the second frequency bin size, or to combine a plurality of spectral values from the second spectral domain representation to acquire a first combined spectral domain representation in which a combined time bin size is equal to the first time bin size, or wherein the first spectral domain representation of the first audio channel of the at least two audio channels comprises a plurality of first spectral values representing the first time bin size and the first frequency bin size, wherein the second spectral domain representation of the second audio channel of the at least two audio channels comprises at least two subframes, wherein each subframe of the at least two subframes comprises a plurality of spectral values representing a second time bin size and a second frequency bin size, wherein the first time bin size is greater than the second time bin size, or wherein the first frequency bin size is lower than the second frequency bin size, wherein the weighting value estimator is configured to combine spectral values belonging to an identical frequency bin from each subframe of the at least two subframes of the second spectral domain representation in a first manner to acquire a first group of combined spectral values, and to combine spectral values belonging to an identical frequency bin from each subframe of the at least two subframes of the second spectral domain representation in a second manner to acquire a second group of combined spectral values, the second manner being different from the first manner, wherein the first group of combined spectral values and the second group of combined spectral values represent a combined spectral domain representation comprising the first time bin size and the first frequency bin size, and to use the spectral values of the combined spectral domain representation and the first spectral domain representation for the estimating of the band-wise weighting values, or wherein the weighting value estimator is configured to calculate a plurality of first band-wise weighting values for a plurality of bands of the first audio channel of the at least two audio channels using a first calculation rule depending on at least two of spectral values of the first spectral domain representation of the first audio channel of the at least two audio channels, spectral values of the second spectral domain representation of the second audio channel of the at least two audio channels, spectral values of a single combined spectral domain representation derived from the spectral values of the first spectral domain representation or the second spectral domain representation, spectral values of a first combined spectral domain representation derived from the spectral values of the first spectral domain representation, and spectral values of a second combined spectral domain representation derived from the spectral values of the second spectral domain representation, and wherein the weighting value estimator is configured to calculate a plurality of second band-wise weighting values for the plurality of bands of the first audio channel of the at least two audio channels using a second calculation rule depending on at least two of the plurality of first band-wise weighting values, the spectral values of the first spectral domain representation of the first audio channel of the at least two audio channels, the spectral values of the second spectral domain representation of the second audio channel of the at least two audio channels, the spectral values of the single combined spectral domain representation derived from the spectral values of the first spectral domain representation or the second spectral domain representation, the spectral values of the first combined spectral domain representation derived from the spectral values of the first spectral domain representation, and the spectral values of the second combined spectral domain representation derived from the spectral values of the second spectral domain representation, wherein the second calculation rule is different from the first calculation rule;

wherein at least one of the weighting value estimator, the spectral weighter, the converter, and the mixer comprises a hardware implementation.

2. The downmixer of claim 1, wherein the weighting value estimator is configured to calculate the plurality of first band-wise weighting values for the plurality of bands of the first audio channel of the at least two audio channels and to calculate the plurality of second band-wise weighting values for the plurality of bands of the second audio channel of the at least two audio channels, or wherein the multi-channel audio signal comprises more than two audio channels and wherein the weighting value estimator is configured to calculate the plurality of first band-wise weighting values for the plurality of bands of the first audio channel of the more than two audio channels, to calculate the plurality of second band-wise weighting values for the plurality of bands of the second audio channel of the more than two audio channels and to calculate a plurality of further band-wise weighting values for the plurality of bands of a further audio channel of the more than two audio channels.

3. The downmixer of claim 1,
wherein the spectral domain representations of the at least two audio channels each comprise a set of frequency bins, where spectral values are associated with the frequency bins,
wherein the weighting value estimator is configured to calculate the band-wise weighting values for the plurality of bands, wherein each band of the plurality of bands comprises one, two or more frequency bins, or
wherein a number of frequency bins per band of the plurality of bands increases with bands of the plurality of bands comprising a higher center frequency.

4. The downmixer of claim 1,
wherein the weighting value estimator is configured to calculate the band-wise weighting values based on a target energy value per band of the plurality of bands, so that an energy in the band of the downmix audio signal is in a predetermined relation to energies in the same bands of the plurality of bands of the at least two audio channels.

5. The downmixer of claim 1, further comprising:
a core decoder for decoding an encoded audio signal, the encoded audio signal comprising encoded spectral domain representations of at least two original audio channels,
wherein the core decoder is configured to generate the spectral domain representations from the encoded spectral domain representations.

6. The downmixer of claim 1, wherein the weighting value estimator is configured to calculate a first weighting value for a band of the plurality of bands of the first audio channel of the at least two audio channels,
wherein the weighting value estimator is configured to calculate a second weighting value for the band of the plurality of bands of the second audio channel of the at least two audio channels, and
wherein the weighting value estimator is configured to calculate the first weighting value and the second weighting value using an energy of the first audio channel of the at least two audio channels in the band of the plurality of bands, an energy of the second audio channel of the at least two audio channels in the band of the plurality of bands, and a mixed term depending on a product or a linear combination of spectral values from the at least two audio channels in the band of the plurality of bands.

7. The downmixer of claim 6,
wherein the weighting value estimator is configured to calculate, as the mixed term depending on the linear combination, a square root of an energy of spectral values added to each other in the band of the plurality of bands from the spectral domain representations of the at least two audio channels, wherein the band of the plurality of bands comprises a plurality of spectral values, or to calculate, as the mixed term depending on the product, an absolute value of a complex dot product between the spectral values in the band of the plurality of bands of the first audio channel of the at least two audio channels and the spectral values in the band of the plurality of bands of the second audio channel of the at least two audio channels.

8. The downmixer of claim 1,
wherein each band of the plurality of bands of the first audio channel of the at least two audio channels and the second audio channel of the at least two audio channels comprises a plurality of spectral values, wherein the spectral weighter is configured to apply the same weight to each spectral value in the band of the plurality of bands of one of the at least two audio channels, and to apply another weight to each spectral value in the band of the plurality of bands of another audio channel of the at least two audio channels.

9. The downmixer of claim 1,
wherein the weighted spectral domain representations are MDCT (modified discrete cosine transform) spectra, and
wherein the converter is configured to perform, for each audio channel of the at least two audio channels, an inverse MDCT transform using a synthesis windowing operation and an overlap-add operation.

10. The downmixer of claim 1,
wherein the mixer is configured to apply a sample-by-sample addition of the time representations of the at least two audio channels, or
wherein the mixer is configured to apply a sample-by-sample addition of the time representations of the at least two audio channels and a scaling operation applied to a result of the sample-by-sample addition or applied to inputs into the sample-by-sample addition.

11. The downmixer of claim 1,
wherein the converter is configured to post process the raw time representations individually, in signal processing direction before the mixing by the mixer, using separate control information for the at least two audio channels to acquire the time representations.

12. The downmixer of claim 11,
wherein the converter is configured to perform, as the post processing, a bass post-filtering, a TCX-LTP (Transform Coded Excitation Long Term Prediction) processing or an LPC (Linear Prediction Coding) synthesis individually for each time representation.

13. The downmixer of claim 1,
wherein the weighting value estimator is configured to use the first combined spectral domain representation or the second combined spectral domain representation for the estimating the band-wise weighting values for the first audio channel of the at least two audio channels and the second audio channel of the at least two audio channels, the estimating comprising a calculation of a mixed term in the bands of the plurality of bands and a calculation of energies in the bands of the plurality of bands, and
wherein the spectral weighter is configured to apply the band-wise weighting values for the first audio channel of the at least two audio channels to spectral values of the first spectral domain representation in corresponding bands of the plurality of bands and to apply the band-wise weighting values for the second audio channel of the at least two audio channels to spectral values of the second spectral domain representation in the corresponding bands of the plurality of bands.

14. The downmixer of claim 1,
wherein the weighting value estimator is configured to perform one of an addition and a subtraction in the first manner and the other of the addition and the subtraction in the second manner.

15. The downmixer of claim 1, wherein the weighting value estimator is configured to perform an average function in the first manner and in the second manner.

16. The downmixer of claim 1, wherein the weighting value estimator is configured to apply either the first manner or the second manner comprising a weighting using a weighting sign, wherein the weighting value estimator is configured to set the weighting sign in accordance with a frequency bin number of an identical frequency bin, or wherein the weighting value estimator is configured to apply, as the first manner, one of a high pass filtering and a low pass filtering, and as the second manner, the other one of a high pass filtering and a low pass filtering.

17. The downmixer of claim 1, wherein the weighting value estimator is configured to transform a lower resolution bin into two higher resolution bins, wherein the first manner is used for an even bin number of a first higher resolution bin of the two higher resolution bins and the second manner is used for an odd bin number of a second higher resolution bin of the two higher resolution bins.

18. The downmixer of claim 1,
wherein the first spectral domain representation of the first audio channel of the at least two audio channels comprises a TCX20 frame, wherein the second spectral domain representation of the second audio channel of the at least two audio channels comprises two TCX10 subframes, wherein the weighting value estimator is configured to calculate a combined TCX20 spectral domain representation from the two TCX10 subframes, or
wherein the first spectral domain representation of the first audio channel of the at least two audio channels comprises the TCX20 frame, wherein the second spectral domain representation of the second audio channel of the at least two audio channels comprises a TCX10 subframe and two TCX5 subframes, wherein the weighting value estimator is configured to calculate a first combined TCX10 spectral domain representation from the two TCX5 subframes and to calculate a second combined TCX20 subframe from the first combined TCX10 spectral domain representation and the TCX10 subframe, or
wherein the first spectral domain representation of the first audio channel of the at least two audio channels comprises a TCX10 subframe, wherein the second spectral domain representation of the second audio channel of the at least two audio channels comprises two TCX5 subframes, and wherein the weighting value estimator is configured to calculate a second combined TCX10 spectral domain representation from the two TCX5 subframes,
wherein an expression TCX20 indicates a first portion with a first time length, wherein an expression TCX10 indicates a second portion with a second time length, and wherein an expression TCX5 indicates a third portion with a third time length, wherein the first time length is longer than the second time length or the third time length, or wherein the second time length is shorter than the first time length or longer than the second time length, and wherein the third time length is shorter than the first time length or shorter than the second time length.

19. The downmixer of claim 1, wherein the weighting value estimator is configured to apply the first manner based on the following equation:

$$MDCT_{2i,k0}=\tfrac{1}{2}(MDCT_{i,k1}+(-1)^i MDCT_{i,k0}), \text{ or}$$

wherein the weighting value estimator is configured to apply the second manner based on the following equation:

$$MDCT_{2i+1,k0}=\tfrac{1}{2}(MDCT_{i,k1}-(-1)^i MDCT_{i,k0}),$$

wherein i specifies a spectral bin number and k0 and k1 specify subframes of the second spectral domain representation of the second audio channel of the at least two audio channels, and
wherein $MDCT_{2i,k0}$ and $MDCT_{2i+1,k0}$ indicate spectral values of the combined spectral domain representation and $MDCT_{i,k1}$ and $MDCT_{i,k0}$ indicate spectral values from a second subframe $k_1$ and a first subframe $k_0$, respectively.

20. A downmixer for downmixing a multi-channel audio signal having at least two audio channels, comprising:
a weighting value estimator configured for estimating band-wise weighting values for the at least two audio channels;
a spectral weighter configured for weighting spectral domain representations of the at least two audio channels using the band-wise weighting values;
a converter configured for converting weighted spectral domain representations of the at least two audio channels into time representations of the at least two audio channels, wherein the converter is configured to generate raw time representations using a spectrum-time algorithm, and to post process, using a post-processor, the raw time representations to acquire the time representations; and
a mixer configured for mixing the time representations of the at least two audio channels to acquire a downmix audio signal,
wherein a first spectral domain representation of a first audio channel of the at least two audio channels comprises a first time resolution or a first frequency resolution, wherein a second spectral domain representation of a second audio channel of the at least two audio channels comprises a second time resolution or a second frequency resolution, wherein the second time resolution is different from the first time resolution or wherein the second frequency resolution is different from the first frequency resolution, wherein the weighting value estimator is configured to convert the first spectral domain representation into a combined spectral domain representation comprising the second time resolution or the second frequency resolution, and to calculate the band-wise weighting values using the combined spectral domain representation and the second spectral domain representation, or to convert the second spectral domain representation into the combined spectral domain representation comprising the first time resolution or the first frequency resolution, and to calculate the band-wise weighting values using the combined spectral domain representation and the first spectral domain representation, or
wherein the first spectral domain representation of the first audio channel of the at least two audio channels comprises the first time resolution or the first frequency resolution, wherein the second spectral domain representation of the second audio channel of the at least two audio channels comprises the second time resolution or the second frequency resolution, wherein the second time resolution is different from the first time resolution or wherein the second frequency resolution is different from the first frequency resolution and wherein the weighting value estimator is configured to convert the first spectral domain representation into a first combined spectral domain representation comprising a third time resolution or a third frequency resolution, wherein the third time resolution is different from the first time resolution or the second time resolution and wherein the third frequency resolution is different from the first frequency resolution or the second frequency resolution, to convert the second spectral domain representation into a second combined spectral domain representation comprising the third time resolution or the third frequency resolution, and to calculate the band-wise weighting values using the first combined spectral domain representation and the second combined spectral domain representation;

wherein at least one of the weighting value estimator, the spectral weighter, the converter, and the mixer comprises a hardware implementation.

21. The downmixer in accordance with claim 20, wherein the second audio channel of the at least two audio channels comprises, for a specific time portion, the second spectral domain representation, wherein the first audio channel of the at least two audio channels comprises, for the specific time portion, two or more first spectral domain representations, wherein the weighting value estimator is configured to convert the two or more first spectral domain representations into the combined spectral domain representation comprising the same time and frequency resolution as the second spectral domain representation, and to calculate the band-wise weighting values using the combined spectral domain representation and the second spectral domain representation, and wherein the spectral weighter is configured to weight the second spectral domain representation using the band-wise weighting values, and to weight each first spectral domain representation of the two or more first spectral domain representations using the same band-wise weighting values.

22. The downmixer in accordance with claim 21, wherein the weighting value estimator is configured, for adding spectral values for the same frequency of the two or more first spectral domain representations to acquire a first spectral value of the combined spectral domain representation, and for subtracting spectral values for the same frequency of the two or more first spectral domain representations to acquire a second spectral value of the combined spectral domain representation being higher and adjacent in frequency to the first spectral value of the combined spectral domain representation, and wherein the spectral weighter is configured to weight a band of a plurality of bands comprising same frequencies in each first spectral domain representation of the two or more first spectral domain representations using the same band-wise weighting value.

23. The downmixer in accordance with claim 20, wherein the second audio channel of the at least two audio channels comprises, for a specific time portion, the second spectral domain representation, wherein the first audio channel of the at least two audio channels comprises, for the specific time portion, two or more first spectral domain representations, wherein the weighting value estimator is configured to convert the second spectral domain representation into two or more combined spectral domain representations comprising the same time and frequency resolution as the two or more first spectral domain representations, to calculate first band-wise weighting values using the first combined spectral domain representation of the two or more combined spectral domain representations and a first spectral domain representation of the two or more first spectral domain representations, to calculate second band-wise weighting values using the second combined spectral domain representation of the two or more combined spectral domain representations and a second first spectral domain representation of the two or more first spectral domain representations, and wherein the spectral weighter is configured to weight the second spectral domain representation using derived band-wise weighting values derived from the first and second band-wise weighting values, to weight the first spectral domain representation of the two or more first spectral domain representations using the first band-wise weighting values and to weight the second first spectral domain representation of the two or more first spectral domain representations using the second band-wise weighting values.

24. The downmixer in accordance with claim 23, wherein the weighting value estimator is configured, for adding spectral values for pairs of frequencies of the second spectral domain representation to acquire an added spectral value and for copying to added spectral value to acquire a combined spectral value for each of the two or more combined spectral domain representations, and wherein the spectral weighter is configured to combine a weighting value for a specific band of a plurality of bands of the first band-wise weighting values with a weighting value for the specific band of a plurality of bands of the second band-wise weighting values to acquire a derived weighting value for the specific band of the plurality of bands of the derived band-wise weighting values.

25. The downmixer in accordance with claim 20, wherein the second audio channel of the at least two audio channels comprises, for a specific time portion, the second spectral domain representation, wherein the first audio channel of the at least two audio channels comprises, for the specific time portion, two or more first spectral domain representations, wherein the weighting value estimator is configured to convert the second spectral domain representation into two or more combined spectral domain representations comprising the same time resolution as the two or more first spectral domain representations, and comprising a frequency resolution being identical to a frequency resolution of the second spectral domain representation, to calculate first band-wise weighting values using the first combined spectral domain representation of the two or more combined spectral domain representations and a first spectral domain representation of the two or more first spectral domain representations, to calculate second band-wise weighting values using the second combined spectral domain representation of the two or more combined spectral domain representations and a second first spectral domain representation of the two or more first spectral domain representations, and wherein the spectral weighter is configured to weight the second spectral domain representation using band-wise weighting values derived from the first band-wise weighting values and second band-wise weighting values, to weight the first spectral domain representation of the two or more first spectral domain representations using the first band-wise weighting values, and to weight the second first spectral domain representation of the two or more first spectral domain representations using the second band-wise weighting values.

26. The downmixer in accordance with claim 25,
wherein the weighting value estimator is configured for upsampling one or more spectral values to acquire a upsampled spectral values for adjacent frequencies of the second spectral domain representation and for copying to upsampled spectral values to acquire combined spectral values for each of the two or more combined spectral domain representations, and
wherein the spectral weighter is configured to combine a weighting value for a specific band of a plurality of bands of the first band-wise weighting values with a weighting value for the specific band of the plurality of bands of the second band-wise weighting values to acquire a derived weighting value for the specific band of the plurality of bands of the derived band-wise weighting values.

27. The downmixer in accordance with claim 20,
wherein the second audio channel of the at least two audio channels comprises, for a specific time portion, the second spectral domain representation,
wherein the first audio channel of the at least two audio channels comprises, for the specific time portion, two or more of the first spectral domain representations,
wherein the weighting value estimator is configured
to convert the two or more first spectral domain representations into the first combined spectral domain representation comprising the same time resolution as the second spectral domain representation,
to convert the second spectral domain representations into the second combined spectral domain representation comprising a frequency resolution being identical to a frequency resolution of as the two or more first spectral domain representations, and
to calculate the band-wise weighting values using the first combined spectral domain representation and the second combined spectral domain representation, and
wherein the spectral weighter is configured to weight the second spectral domain representation using the band-wise weighting values, and to weight each first spectral domain representation of the two or more first spectral domain representations using the same band-wise weighting values.

28. The downmixer in accordance with claim 27,
wherein the weighting value estimator is configured for adding spectral values for pairs of frequencies of the second spectral domain representation to acquire the second combined spectral domain representation, and for adding spectral values having an identical frequency of the two or more of the first spectral domain representations to acquire the first combined spectral domain representation, and
wherein the spectral weighter is configured to weight a band of a plurality of bands comprising the same frequencies in each first spectral domain representation of the two or more first spectral domain representations using the same band-wise weighting value.

29. A downmixer for downmixing a multi-channel audio signal comprising at least two audio channels, comprising:
a weighting value estimator configured for estimating band-wise weighting values for the at least two audio channels, wherein the weighting value estimator is configured to calculate the band-wise weighting values based on a target energy value for a band of a plurality of bands, so that an energy in the band of the plurality of bands of a downmix audio signal is in a predetermined relation to energies in the same bands of the plurality of bands of the at least two audio channels;
a spectral weighter configured for weighting spectral domain representations of the at least two audio channels using the band-wise weighting values to acquire weighted spectral domain representations;
a mixer configured for calculating the downmix audio signal using the weighted spectral domain representations of the at least two audio channels; and
a mono signal processor for processing the downmix audio signal and configured to be controlled by data or being implemented as a frequency-time converter,
wherein the spectral domain representations are either purely real or purely imaginary, wherein the weighting value estimator is configured to obtain an estimated imaginary spectral domain representation when a spectral domain representation of the spectral domain representations is purely real, or to obtain an estimated real spectral domain representation when the spectral domain representation of the spectral domain representations is purely imaginary, and wherein the weighting value estimator is configured to estimate the band-wise weighting values using the estimated imaginary spectral domain representation or the estimated real spectral domain representation, or
wherein the weighting value estimator is configured to calculate the band-wise weighting values for a first audio channel of the at least two audio channels based on the following equation:

$$w_R = \frac{1}{2\sqrt{2}} \frac{\sqrt{|L|^2 + |R|^2 + 2|\langle L, R\rangle|}}{|L| + |R|}$$

wherein $w_R$ is a weighting factor for the first audio channel of the at least two audio channels for the band of the plurality of bands, wherein $|L|^2$ is an estimated power for a second audio channel of the at least two audio channels, wherein $|R|^2$ is an estimated power for the first audio channel of the at least two audio channels in the band of the plurality of bands, wherein $2|\langle L, R\rangle|$ is an estimated dot product between the first audio channel of the at least two audio channels and the second audio channel of the at least two audio channels in the band of the plurality of bands, wherein $|L|$ is an estimated amplitude for the second audio channel of the at least two audio channels in the band of the plurality of bands, wherein $|R|$ is an estimated amplitude for the first audio channel of the at least two audio channels in the band of the plurality of bands, or
wherein each band of the plurality of bands of the first audio channel of the at least two audio channels and the second audio channel of the at least two audio channels comprises a plurality of spectral values, wherein the spectral weighter is configured to apply the same weight to each spectral value in the band of the plurality of bands of one of the at least two audio channels, and to apply another weight to each spectral value in the band of the plurality of bands of another audio channel of the at least two audio channels, or
wherein the weighting value estimator is configured to calculate the estimated amplitude for the second audio channel of the at least two audio channels in the band of the plurality of bands, and to calculate the estimated amplitude for the first audio channel of the at least two audio channels in the band of the plurality of bands based on the following equations:

$$|L| = \sqrt{\sum_{i\,in\,b}(MDCT_{i,l}^2 + MDST_{i,l}^2)}, |R| = \sqrt{\sum_{i\,in\,b}(MDCT_{i,r}^2 + MDST_{i,r}^2)},$$

or
  wherein the weighting value estimator is configured to calculate an estimated linear combination of the estimated amplitudes for the first audio channel of the at least two audio channels and the second audio channel of the at least two audio channels in the band of the plurality of bands based on the following equation:

$$|L+R| = \sqrt{|L|^2 + |R|^2 + 2(\Sigma_{i\,in\,b}(MDCT_{i,l}MDCT_{i,r} + MDST_{i,l}MDST_{i,r}))^2},$$

or
  wherein the weighting value estimator is configured to calculate the estimated dot product between the first audio channel of the at least two audio channels and the second audio channel of the at least two audio channels in the band of the plurality of bands based on the following equation:

$$|\langle L, R \rangle| = \sqrt{\frac{(\Sigma_{i\,in\,b}(MDCT_{i,l}MDCT_{i,r} + MDST_{i,l}MDST_{i,r}))^2 +}{(\Sigma_{i\,in\,b}(MDST_{i,l}MDCT_{i,r} - MDCT_{i,l}MDST_{i,r}))^2}},$$

or
  wherein the weighting value estimator is configured to calculate the estimated power for the second audio channel of the at least two audio channels in the band of the plurality of bands or the estimated power for the first audio channel of the at least two audio channels in the band of the plurality of bands based on the following equation:

$$|L|^2 = \sum_{i\,in\,b}(MDCT_{i,l}^2 + MDST_{i,l}^2),\ |R|^2 = \sum_{i\,in\,b}(MDCT_{i,r}^2 + MDST_{i,r}^2)$$

wherein i specifies a bin number inside a band b of the plurality of bands, the band b being a spectral band, and wherein $MDST_i$ represents an estimated imaginary part of an MDCT bin i, wherein $MDCT_i$ represents a real part of the MDCT bin i comprised in the spectral domain representation of the first audio channel of the at least two audio channels or the second audio channel of the at least two audio channels, wherein r represents the first audio channel of the at least two audio channels, and wherein l represents the second audio channel of the at least two audio channels;
  wherein at least one of the weighting value estimator, the spectral weighter, and the mixer comprises a hardware implementation.

30. The downmixer of claim 29, wherein the weighting value estimator is configured to calculate a first weighting value for the band of the plurality of bands of the first audio channel of the at least two audio channels, to calculate a second weighting value for the band of the plurality of bands of the second audio channel of the at least two audio channels, and to calculate the first weighting value and the second weighting value using an energy of the first audio channel of the at least two audio channels in the band of the plurality of bands, an energy of the second audio channel of the at least two audio channels in the band, and a mixed term depending on a product or a linear combination of spectral values from the at least two audio channels in the band of the plurality of bands.

31. The downmixer of claim 30,
  wherein the weighting value estimator is configured to calculate, as the mixed term depending on the linear combination, a square root of an energy of spectral values added to each other in the band of the plurality of bands from the spectral domain representations of the at least two audio channels, wherein the band of the plurality of bands comprises a plurality of spectral values, or to calculate, as the mixed term depending on the product, an absolute value of a complex dot product between the spectral values in the band of the plurality of bands of the first audio channel of the at least two audio channels and the spectral values in the band of the plurality of bands of the second audio channel of the at least two audio channels.

32. The downmixer of claim 29,
  wherein each band of the plurality of bands of the first audio channel of the at least two audio channels and the second audio channel of the at least two audio channels comprises a plurality of spectral values, wherein the spectral weighter is configured to apply the same weight to each spectral value in the band of the plurality of bands of one of the at least two audio channels, and to apply another weight to each spectral value in the band of the plurality of bands of another audio channel of the at least two audio channels.

33. The downmixer of claim 29, wherein the weighting value estimator is configured to calculate the band-wise weighting values for the second audio channel of the at least two audio channels based on the following equation:

$$w_L = w_R + 1 - \frac{|L+R|}{|L|+|R|},$$

wherein $w_L$ is a weighting factor for the second audio channel of the at least two audio channels for the band of the plurality of bands, and wherein |L+R| is the estimated linear combination of the estimated amplitudes for the first audio channel of the at least two audio channels and the second audio channel of the at least two audio channels in the band of the plurality of bands.

34. A downmixer for downmixing a multi-channel audio signal comprising at least two audio channels, comprising:
  a weighting value estimator configured for estimating band-wise weighting values for the at least two audio channels, wherein the weighting value estimator is configured to calculate the band-wise weighting values based on a target energy value for a band of a plurality of bands, so that an energy in the band of the plurality of bands of a downmix audio signal is in a predetermined relation to energies in the same bands of the plurality of bands of the at least two audio channels;
  a spectral weighter configured for weighting spectral domain representations of the at least two audio channels using the band-wise weighting values to acquire weighted spectral domain representations;
  a mixer configured for calculating the downmix audio signal using the weighted spectral domain representations of the at least two audio channels; and a post-processor configured for post-processing the downmix audio signal, wherein a first spectral domain representation of a first audio channel of the at least two audio channels comprises a first time resolution or a first frequency resolution, wherein a second spectral domain representation of a second audio channel of the at least two audio channels comprises a second time resolution or a second frequency resolution, wherein the second time resolution is different from the first time resolution and wherein the second frequency resolution is different from the first frequency resolution, and wherein the weighting value estimator is configured to convert the first spectral domain representation into a combined spectral domain representation comprising the second time resolution or the second frequency resolution, and to calculate the band-wise weighting values using the combined spectral domain representation and the second spectral domain representation, or to convert the second spectral domain representation into the combined spectral domain representation comprising the first time resolution or the first frequency resolution, and to calculate the band-wise weighting values using the combined spectral domain representation and the first spectral domain representation, or wherein the first spectral domain representation of the first audio channel of the at least two audio channels comprises the first time resolution or the first frequency resolution, wherein the second spectral domain representation of the second audio channel of the at least two audio channels comprises the second time resolution or the second frequency resolution, wherein the second time resolution is different from the first time resolution and wherein the second frequency resolution is different from the first frequency resolution, and wherein the weighting value estimator is configured to convert the first spectral domain representation into a first combined spectral domain representation comprising a third time resolution or a third frequency resolution, wherein the third time resolution is different from the first time resolution or the second time resolution and wherein the third frequency resolution is different from the first frequency resolution or the second frequency resolution, to convert the second spectral domain representation into a second combined spectral domain representation comprising the third time resolution or the third frequency resolution, and to calculate the band-wise weighting values using the first combined spectral domain representation and the second combined spectral domain representation, wherein at least one of the weighting value estimator, the spectral weighter, and the mixer comprises a hardware implementation.

35. The downmixer of claim 34, wherein the spectral weighter is configured for weighting, as the spectral domain representations of the at least two audio channels, one of the combined spectral domain representation and the second spectral domain representation, the combined spectral domain representation and the first spectral domain representation, and the first combined spectral domain representation and the second combined spectral domain representation to acquire a first weighted spectral domain representation and a second weighted spectral domain representation.

36. The downmixer of claim 35, wherein the mixer is configured for adding the first and second weighted spectral domain representations to acquire a spectral domain downmix representation and for converting the spectral domain downmix representation into a time domain to acquire the downmix audio signal, or for converting the first and second weighted spectral domain representations into a time domain to acquire time representations of the at least two audio channels and for adding the time representations of the at least two audio channels to acquire the downmix audio signal.

37. A method for downmixing a multi-channel audio signal comprising at least two audio channels, the method comprising:

estimating band-wise weighting values for the at least two audio channels;

weighting spectral domain representations of the at least two audio channels using the band-wise weighting values;

converting weighted spectral domain representations of the at least two audio channels into time representations of the at least two audio channels, wherein the converting comprises generating raw time representations using a spectrum-time algorithm, and post processing, using a post-processor, the raw time representations to acquire the time representations; and mixing the time representations of the at least two audio channels to acquire a downmix audio signal, wherein the spectral domain representations are either purely real or purely imaginary, wherein the estimating comprises estimating an imaginary spectral domain representation when a spectral domain representation of the spectral domain representations is purely real, or estimating a real spectral domain representation when the spectral domain representation of the spectral domain representations is purely imaginary, and estimating the band-wise weighting values using the estimated imaginary spectral domain representation or the estimated real spectral domain representation, or wherein a first spectral domain representation of a first audio channel of the at least two audio channels comprises a first time resolution or a first frequency resolution, wherein a second spectral domain representation of a second audio channel of the at least two audio channels comprises a second time resolution or a second frequency resolution, wherein the second time resolution or the second frequency resolution is different from the first time resolution or the first frequency resolution, and wherein the estimating comprises calculating the band-wise weighting values so that a frequency resolution of bands of a plurality of bands associated with the band-wise weighting values is lower than the first frequency resolution and the second frequency resolution or is equal to the lower one of the first and the second frequency resolution, or wherein the first spectral domain representation comprises a first plurality of spectral values in a band of the plurality of bands, wherein the second spectral domain representation comprises a second plurality of spectral values in the band of the plurality of bands, the second plurality of spectral values being higher than the first plurality, and wherein the estimating comprises combining two or more spectral values of the second plurality of spectral values or selecting, from the second plurality of spectral values, a subset of spectral values, calculating a mixed term depending on products or linear combinations of spectral values from the at least two audio channels in the band of the plurality of bands using a result of the combining the two or more spectral values or using the subset of spectral values, and calculating the band-wise weighting values using the mixed term, or wherein the first spectral domain representation comprises a plurality of first spectral values representing a first time bin size and a first frequency bin size, wherein the second spectral domain representation comprises a plurality of spectral values representing a second time bin size and a second frequency bin size, wherein the first time bin size is greater than the second time bin size, or wherein the first frequency bin size is lower than the second frequency bin size, wherein the estimating comprises combining a plurality of spectral values from the first spectral domain representation to acquire a first combined spectral domain representation in which a combined frequency bin size is equal to the second frequency bin size, or combining a plurality of spectral values from the second spectral domain representation to acquire a first combined spectral domain representation in which a combined time bin size is equal to the first time bin size, or wherein the first spectral domain representation of the first audio channel of the at least two audio channels comprises a plurality of first spectral values representing the first time bin size and the first frequency bin size, wherein the second spectral domain representation of the second audio channel of the at least two audio channels comprises at least two subframes, wherein each subframe comprises a plurality of spectral values representing the second time bin size and the second frequency bin size, wherein the first time bin size is greater than the second time bin size, or wherein the first frequency bin size is lower than the second frequency bin size, wherein the estimating comprises combining spectral values belonging to an identical frequency bin from each subframe of the second spectral domain representation in a first manner to acquire a first group of combined spectral values, and combining spectral values belonging to an identical frequency bin from each subframe of the second spectral domain representation in a second manner to acquire a second group of combined spectral values, the second manner being different from the first manner, wherein the first group of combined spectral values and the second group of combined spectral values represent a combined spectral domain representation comprising the first time bin size and the first frequency bin size, and using the spectral values of the combined spectral domain representation and the first spectral domain representation for the estimating of the band-wise weighting values, or wherein the estimating comprises calculating a plurality of first band-wise weighting values for a plurality of bands of the first audio channel of the at least two audio channels using a first calculation rule depending on at least two of spectral values of the first spectral domain representation of the first audio channel of the at least two audio channels, spectral values of the second spectral domain representation of the second audio channel of the at least two audio channels, spectral values of a single combined spectral domain representation derived from the spectral values of the first spectral domain representation or the second spectral domain representation, spectral values of a first combined spectral domain representation derived from the spectral values of the first spectral domain representation, and spectral values of a second combined spectral domain representation derived from the spectral values of the second spectral domain representation, and wherein the estimating comprises calculating a plurality of second band-wise weighting values for the plurality of bands of the first audio channel of the at least two audio channels using a second calculation rule depending on at least two of the plurality of first band-wise weighting values, the spectral values of the first spectral domain representation of the first audio channel of the at least two audio channels, the spectral values of the second spectral domain representation of the second audio channel of the at least two audio channels, the spectral values of the single combined spectral domain representation derived from the spectral values of the first spectral domain representation or the second spectral domain representation, the spectral values of the first combined spectral domain representation derived from the spectral values of the first spectral domain representation, and the spectral values of the second combined spectral domain representation derived from the spectral values of the second spectral domain representation, wherein the second calculation rule is different from the first calculation rule, or wherein the first spectral domain representation of the first audio channel of the at least two audio channels comprises a first time resolution or a first frequency resolution, wherein the second spectral domain representation of the second audio channel of the at least two audio channels comprises a second time resolution or a second frequency resolution, wherein the second time resolution is different from the first time resolution or wherein the second frequency resolution is different from the first frequency resolution, and wherein the estimating comprises converting the first spectral domain representation into a combined spectral domain representation comprising the second time resolution or the second frequency resolution, and calculating the band-wise weighting values using the combined spectral domain representation and the second spectral domain representation, or converting the second spectral domain representation into a combined spectral domain representation comprising the first time resolution or the first frequency resolution, and calculating the band-wise weighting values using the combined spectral domain representation and the first spectral domain representation, or wherein the first spectral domain representation of the first audio channel of the at least two audio channels comprises a first time resolution or a first frequency resolution, wherein the second spectral domain representation of the second audio channel of the at least two audio channels comprises a second time resolution or a second frequency resolution, wherein the second time resolution is different from the first time resolution or wherein the second frequency resolution is different from the first frequency resolution and wherein the estimating comprises converting the first spectral domain representation into a first combined spectral domain representation comprising a third time resolution or a third frequency resolution, wherein the third time resolution is different from the first time resolution or the second time resolution and wherein the third frequency resolution is different from the first frequency resolution or the second frequency resolution, converting the second spectral domain representation into a second combined spectral domain representation comprising the third time resolution or the third frequency resolution, and calculating the band-wise weighting values using the first combined spectral domain representation and the second combined spectral domain representation, wherein at least one of the estimating, the weighting, and the calculating is performed at least partly by a hardware implementation.

38. A method for downmixing a multi-channel audio signal comprising at least two audio channels, the method comprising:

estimating band-wise weighting values for the at least two audio channels, comprising calculating the band-wise weighting values based on a target energy value for a band of a plurality of bands, so that an energy in the band of the plurality of bands of a downmix audio signal is in a predetermined relation to energies in the same bands of a plurality of bands of the at least two audio channels;

weighting spectral domain representations of the at least two audio channels using the band-wise weighting values to acquire weighted spectral domain representations; and calculating the downmix audio signal using the weighted spectral domain representations of the at least two audio channels; and processing, using a mono signal processor, the downmix audio signal, wherein the processing is controlled by data or comprises a frequency-time converting operation, wherein the spectral domain representations are either purely real or purely imaginary, wherein the estimating comprises estimating an imaginary spectral domain representation when a spectral domain representation of the spectral domain representations is purely real, or estimating a real spectral domain representation when the spectral domain representation of the spectral domain representations is purely imaginary, and estimating the band-wise weighting values using the estimated imaginary spectral domain representation or the estimated real spectral domain representation, or wherein the estimating comprises calculating the band-wise weighting values for a first audio channel of the at least two audio channels based on the following equation:

$$w_R = \frac{1}{2\sqrt{2}} \frac{\sqrt{|L|^2 + |R|^2 + 2|\langle L, R \rangle|}}{|L| + |R|}$$

wherein $w_R$ is a weighting factor for the first audio channel of the at least two audio channels for the band of the plurality of bands, wherein $|L|^2$ is an estimated power for a second audio channel of the at least two audio channels, wherein $|R|^2$ is an estimated power for the first audio channel of the at least two audio channels in the band of the plurality of bands, wherein $2|\langle L, R \rangle|$ is an estimated dot product between the first audio channel of the at least two audio channels and the second audio channel of the at least two audio channels in the band of the plurality of bands, wherein $|L|$ is an estimated amplitude for the second audio channel in the band of the plurality of bands, wherein $|R|$ is an estimated amplitude for the first audio channel of the at least two audio channels in the band of the plurality of bands, or wherein each band of the plurality of bands of the first audio channel of the at least two audio channels and the second audio channel of the at least two audio channels comprises a plurality of spectral values, wherein the weighting comprises to applying the same weight to each spectral value in the band of the plurality of bands of one of the at least two audio channels, and applying another weight to each spectral value in the band of the plurality of bands of another audio channel of the at least two audio channels, or wherein the estimating comprises calculating the estimated amplitude for the second audio channel of the at least two audio channels in the band of the plurality of bands, and calculating the estimated amplitude for the first audio channel of the at least two audio channels in the band of the plurality of bands based on the following equations:

$$|L| = \sqrt{\sum_{i \, in \, b}(MDCT_{i,l}^2 + MDST_{i,l}^2)}, \; |R| = \sqrt{\sum_{i \, in \, b}(MDCT_{i,r}^2 + MDST_{i,r}^2)},$$

or wherein the estimating comprises calculating an estimated linear combination of the estimated amplitudes for the first audio channel of the at least two audio channels and the second audio channel of the at least two audio channels in the band of the plurality of bands based on the following equation:

$$|L + R| = \sqrt{|L|^2 + |R|^2 + 2\left(\sum_{i \, in \, b}(MDCT_{i,l}MDCT_{i,r} + MDST_{i,l}MDST_{i,r})\right)^2},$$

or wherein the estimating comprises calculating the estimated dot product between the first audio channel of the at least two audio channels and the second audio channel of the at least two audio channels in the band of the plurality of bands based on the following equation:

$$|\langle L, R \rangle| = \sqrt{\left(\sum_{i \, in \, b}(MDCT_{i,l}MDCT_{i,r} + MDST_{i,l}MDST_{i,r})\right)^2 + \left(\sum_{i \, in \, b}(MDST_{i,l}MDCT_{i,r} - MDCT_{i,l}MDST_{i,r})\right)^2}$$

or wherein the estimating comprises calculating the estimated power for the second audio channel of the at least two audio channels in the band of the plurality of bands or the estimated power for the first audio channel of the at least two audio channels in the band of the plurality of bands based on the following equation:

$$|L|^2 = \sum_{i \, in \, b}(MDCT_{i,l}^2 + MDST_{i,l}^2), \; |R|^2 = \sum_{i \, in \, b}(MDCT_{i,r}^2 + MDST_{i,r}^2),$$

wherein i specifies a bin number inside a band b of the plurality of bands, the band b being a spectral band, and wherein $MDST_i$ represents an estimated imaginary part of an MDCT bin i, wherein $MDCT_i$ represents a real part of the MDCT bin i comprised in the spectral domain representation of the first audio channel of the at least two audio channels or the second audio channel of the at least two audio channels, wherein r represents the first audio channel of the at least two audio channels, and wherein l represents the second audio channel of the at least two audio channels, or wherein a first spectral domain representation of the first audio channel of the at least two audio channels comprises a first time resolution or a first frequency resolution, wherein a second spectral domain representation of the second audio channel of the at least two audio channels comprises a second time resolution or a second frequency resolution, wherein the second time resolution is different from the first time resolution and wherein the second frequency resolution is different from the first frequency resolution, and wherein the estimating comprises converting the first spectral domain representation into a combined spectral domain representation comprising the second time resolution or the second frequency resolution, and calculating the band-wise weighting values using the combined spectral domain representation and the second spectral domain representation, or converting the second spectral domain representation into the combined spectral domain representation comprising the first time resolution or the first frequency resolution, and calculating the band-wise weighting values using the combined spectral domain representation and the first spectral domain representation, or wherein the first spectral domain representation of the first audio channel of the at least two audio channels comprises the first time resolution or the first frequency resolution, wherein the second spectral domain representation of the second audio channel of the at least two audio channels comprises the second time resolution or the second frequency resolution, wherein the second time resolution is different from the first time resolution and wherein the second frequency resolution is different from the first frequency resolution, and wherein the estimating comprises converting the first spectral domain representation into a first combined spectral domain representation comprising a third time resolution or a third frequency resolution, wherein the third time resolution is different from the first time resolution or the second time resolution and wherein the third frequency resolution is different from the first frequency resolution or the second frequency resolution, converting the second spectral domain representation into a second combined spectral domain representation comprising the third time resolution or the third frequency resolution, and calculating the band-wise weighting values using the first combined spectral domain representation and the second combined spectral domain representation, wherein at least one of the estimating, the weighting, and the calculating is performed at least partly by a hardware implementation.

39. A non-transitory digital storage medium having a computer program stored thereon to perform, when said computer program is run by a computer, a method for downmixing a multi-channel audio signal comprising at least two audio channels, the method comprising:

estimating band-wise weighting values for the at least two audio channels;

weighting spectral domain representations of the at least two audio channels using the band-wise weighting values;

converting weighted spectral domain representations of the at least two audio channels into time representations of the at least two audio channels, wherein the converting comprises generating raw time representations using a spectrum-time algorithm, and post processing the raw time representations to acquire the time representations; and mixing the time representations of the at least two audio channels to acquire a downmix audio signal, wherein the spectral domain representations are either purely real or purely imaginary, wherein the estimating comprises estimating an imaginary spectral domain representation when a spectral domain representation of the spectral domain representations is purely real, or estimating a real spectral domain representation when the spectral domain representation of the spectral domain representations is purely imaginary, and estimating the band-wise weighting values using the estimated imaginary spectral domain representation or the estimated real spectral domain representation, or wherein a first spectral domain representation of a first audio channel of the at least two audio channels comprises a first time resolution or a first frequency resolution, wherein a second spectral domain representation of a second audio channel of the at least two audio channels comprises a second time resolution or a second frequency resolution, wherein the second time resolution or the second frequency resolution is different from the first time resolution or the first frequency resolution, and wherein the estimating comprises calculating the band-wise weighting values so that a frequency resolution of bands of a plurality of bands associated with the band-wise weighting values is lower than the first frequency resolution and the second frequency resolution or is equal to the lower one of the first and the second frequency resolution, or wherein the first spectral domain representation comprises a first plurality of spectral values in a band of a plurality of bands, wherein the second spectral domain representation comprises a second plurality of spectral values in the band of the plurality of bands, the second plurality of spectral values being higher than the first plurality, and wherein the estimating comprises combining two or more spectral values of the second plurality of spectral values or selecting, from the second plurality of spectral values, a subset of spectral values, calculating a mixed term depending on products or linear combinations of spectral values from the at least two audio channels in the band of the plurality of bands using a result of the combining the two or more spectral values or using the subset of spectral values, and calculating the band-wise weighting values using the mixed term, or wherein the first spectral domain representation comprises a plurality of first spectral values representing a first time bin size and a first frequency bin size, wherein the second spectral domain representation comprises a plurality of spectral values representing a second time bin size and a second frequency bin size, wherein the first time bin size is greater than the second time bin size, or wherein the first frequency bin size is lower than the second frequency bin size, wherein the estimating comprises combining a plurality of spectral values from the first spectral domain representation to acquire a first combined spectral domain representation in which a combined frequency bin size is equal to the second frequency bin size, or combining a plurality of spectral values from the second spectral domain representation to acquire the first combined spectral domain representation in which a combined time bin size is equal to the first time bin size, or wherein the first spectral domain representation of the first audio channel of the at least two audio channels comprises a plurality of first spectral values representing the first time bin size and the first frequency bin size, wherein the second spectral domain representation of the second audio channel of the at least two audio channels comprises at least two subframes, wherein each subframe comprises a plurality of spectral values representing the second time bin size and the second frequency bin size, wherein the first time bin size is greater than the second time bin size, or wherein the first frequency bin size is lower than the second frequency bin size, wherein the estimating comprises combining spectral values belonging to an identical frequency bin from each subframe of the second spectral domain representation in a first manner to acquire a first group of combined spectral values, and combining spectral values belonging to an identical frequency bin from each subframe of the second spectral domain representation in a second manner to acquire a second group of combined spectral values, the second manner being different from the first manner, wherein the first group of combined spectral values and the second group of combined spectral values represent a combined spectral domain representation comprising the first time bin size and the first frequency bin size, and using the spectral values of the combined spectral domain representation and the first spectral domain representation for the estimating of the band-wise weighting values, or wherein the estimating comprises calculating a plurality of first band-wise weighting values for a plurality of bands of the first audio channel of the at least two audio channels using a first calculation rule depending on at least two of spectral values of the first spectral domain representation of the first audio channel of the at least two audio channels, spectral values of the second spectral domain representation of the second audio channel of the at least two audio channels, spectral values of a single combined spectral domain representation derived from the spectral values of the first spectral domain representation or the second spectral domain representation, spectral values of the first combined spectral domain representation derived from the spectral values of the first spectral domain representation, and spectral values of a second combined spectral domain representation derived from the spectral values of the second spectral domain representation, and wherein the estimating comprises calculating a plurality of second band-wise weighting values for the plurality of bands of the first audio channel of the at least two audio channels using a second calculation rule depending on at least two of the plurality of first band-wise weighting values, the spectral values of the first spectral domain representation of the first audio channel of the at least two audio channels, the spectral values of the second spectral domain representation of the second audio channel of the at least two audio channels, the spectral values of the single combined spectral domain representation derived from the spectral values of the first spectral domain representation or the second spectral domain representation, the spectral values of the first combined spectral domain representation derived from the spectral values of the first spectral domain representation, and the spectral values of the second combined spectral domain representation derived from the spectral values of the second spectral domain representation, wherein the second calculation rule is different from the first calculation rule, or wherein the first spectral domain representation of the first audio channel of the at least two audio channels comprises the first time resolution or the first frequency resolution, wherein the second spectral domain representation of the second audio channel of the at least two audio channels comprises the second time resolution or the second frequency resolution, wherein the second time resolution is different from the first time resolution or wherein the second frequency resolution is different from the first frequency resolution, and wherein the estimating comprises converting the first spectral domain representation into the combined spectral domain representation comprising the second time resolution or the second frequency resolution, and calculating the band-wise weighting values using the combined spectral domain representation and the second spectral domain representation, or converting the second spectral domain representation into the combined spectral domain representation comprising the first time resolution or the first frequency resolution, and calculating the band-wise weighting values using the combined spectral domain representation and the first spectral domain representation, or wherein the first spectral domain representation of the first audio channel of the at least two audio channels comprises the first time resolution or the first frequency resolution, wherein the second spectral domain representation of the second audio channel of the at least two audio channels comprises the second time resolution or the second frequency resolution, wherein the second time resolution is different from the first time resolution or wherein the second frequency resolution is different from the first frequency resolution and wherein the estimating comprises converting the first spectral domain representation into the first combined spectral domain representation comprising a third time resolution or a third frequency resolution, wherein the third time resolution is different from the first time resolution or the second time resolution and wherein the third frequency resolution is different from the first frequency resolution or the second frequency resolution, converting the second spectral domain representation into the second combined spectral domain representation comprising the third time resolution or the third frequency resolution, and calculating the band-wise weighting values using the first combined spectral domain representation and the second combined spectral domain representation.

40. A non-transitory digital storage medium having a computer program stored thereon to perform, when said computer program is run by a computer, a method of downmixing a multi-channel audio signal comprising at least two audio channels, the method comprising:

estimating band-wise weighting values for the at least two audio channels, comprising calculating the band-wise weighting values based on a target energy value for a band of a plurality of bands, so that an energy in the band of a plurality of bands of a downmix audio signal is in a predetermined relation to energies in the same bands of the plurality of bands of the at least two audio channels;

weighting spectral domain representations of the at least two audio channels using the band-wise weighting values to acquire weighted spectral domain representations;
calculating the downmix audio signal using the weighted spectral domain representations of the at least two audio channels; and
processing the downmix audio signal, wherein the processing is controlled by data or comprises a frequency-time converting operation,
wherein the spectral domain representations are either purely real or purely imaginary, wherein the estimating comprises estimating an imaginary spectral domain representation when a spectral domain representation of the spectral domain representations is purely real, or estimating a real spectral domain representation when the spectral domain representation of the spectral domain representations is purely imaginary, and estimating the band-wise weighting values using the estimated imaginary spectral domain representation or the estimated real spectral domain representation, or
wherein the estimating comprises calculating the band-wise weighting values for a first audio channel of the at least two audio channels based on the following equation:

$$w_R = \frac{1}{2\sqrt{2}} \frac{\sqrt{|L|^2 + |R|^2 + 2|\langle L, R \rangle|}}{|L| + |R|}$$

wherein $w_R$ is a weighting factor for the first audio channel of the at least two audio channels for the band of the plurality of bands, wherein $|L|^2$ is an estimated power for a second audio channel of the at least two audio channels, wherein $|R|^2$ is an estimated power for the first audio channel of the at least two audio channels in the band of the plurality of bands, wherein $2|\langle L, R \rangle|$ is an estimated dot product between the first audio channel of the at least two audio channels and the second audio channel of the at least two audio channels in the band of the plurality of bands, wherein $|L|$ is an estimated amplitude for the second audio channel of the at least two audio channels in the band of the plurality of bands, wherein $|R|$ is an estimated amplitude for the first audio channel of the at least two audio channels in the band of the plurality of bands, or
wherein each band of the plurality of bands of the first audio channel of the at least two audio channels and the second audio channel of the at least two audio channels comprises a plurality of spectral values, wherein the weighting comprises to applying the same weight to each spectral value in the band of the plurality of bands of one of the at least two audio channels, and applying another weight to each spectral value in the band of the plurality of bands of another channel of the at least two audio channels, or
wherein the estimating comprises calculating the estimated amplitude for the second audio channel of the at least two audio channels in the band of the plurality of bands, and calculating the estimated amplitude for the first audio channel of the at least two audio channels in the band of the plurality of bands based on the following equations:

$$|L| = \sqrt{\sum_{i \, in \, b}(MDCT_{i,l}^2 + MDST_{i,l}^2)}, \; |R| = \sqrt{\sum_{i \, in \, b}(MDCT_{i,r}^2 + MDST_{i,r}^2)},$$

or
wherein the estimating comprises calculating an estimated linear combination of the estimated amplitudes for the first audio channel of the at least two audio channels and the second audio channel of the at least two audio channels in the band of the plurality of bands based on the following equation:

$$|L + R| = \sqrt{|L|^2 + |R|^2 + 2\left(\sum_{i \, in \, b}(MDCT_{i,l}MDCT_{i,r} + MDST_{i,l}MDST_{i,r})\right)^2},$$

or
wherein the estimating comprises calculating the estimated dot product between the first audio channel of the at least two audio channels and the second audio channel of the at least two audio channels in the band of the plurality of bands based on the following equation:

$$|\langle L, R \rangle| = \sqrt{\left(\sum_{i \, in \, b}(MDCT_{i,l}MDCT_{i,r} + MDST_{i,l}MDST_{i,r})\right)^2 + \left(\sum_{i \, in \, b}(MDST_{i,l}MDCT_{i,r} - MDCT_{i,l}MDST_{i,r})\right)^2},$$

or
wherein the estimating comprises calculating the estimated power for the second audio channel of the at least two audio channels in the band of the plurality of bands or the estimated power for the first audio channel of the at least two audio channels in the band of the plurality of bands based on the following equation:

$$|L|^2 = \sum_{i \, in \, b}(MDCT_{i,l}^2 + MDST_{i,l}^2), \; |R|^2 = \sum_{i \, in \, b}(MDCT_{i,r}^2 + MDST_{i,r}^2),$$

wherein i specifies a bin number inside a band b of the plurality of bands, the band b being a spectral band, and wherein $MDST_i$ represents an estimated imaginary part of an MDCT bin i, wherein $MDCT_i$ represents a real part of the MDCT bin i comprised in the spectral domain representation of the first audio channel of the at least two audio channels or the second audio channel of the at least two audio channels, wherein r represents the first audio channel of the at least two audio channels, and wherein l represents the second audio channel of the at least two audio channels, or
wherein a first spectral domain representation of the first audio channel of the at least two audio channels comprises a first time resolution or a first frequency resolution, wherein a second spectral domain representation of the second audio channel of the at least two audio channels comprises a second time resolution or a second frequency resolution, wherein the second time resolution is different from the first time resolution and wherein the second frequency resolution is different from the first frequency resolution, and wherein the estimating comprises converting the first spectral domain representation into a combined spectral domain representation comprising the second time resolution or the second frequency resolution, and calculating the band-wise weighting values using the combined spectral domain representation and the second spectral domain representation, or converting the second spectral domain representation into the combined spectral domain representation comprising the first time resolution or the first frequency resolution, and calculating the band-wise weighting values using the combined spectral domain representation and the first spectral domain representation, or wherein the first spectral domain representation of the first audio channel of the at least two audio channels comprises the first time resolution or the first frequency resolution, wherein the second spectral domain representation of the second audio channel of the at least two audio channels comprises the second time resolution or the second frequency resolution, wherein the second time resolution is different from the first time resolution and wherein the second frequency resolution is different from the first frequency resolution, and wherein the estimating comprises converting the first spectral domain representation into a first combined spectral domain representation comprising a third time resolution or a third frequency resolution, wherein the third time resolution is different from the first time resolution or the second time resolution and wherein the third frequency resolution is different from the first frequency resolution or the second frequency resolution, converting the second spectral domain representation into a second combined spectral domain representation comprising the third time resolution or the third frequency resolution, and calculating the band-wise weighting values using the first combined spectral domain representation and the second combined spectral domain representation.

* * * * *

UNITED STATES PATENT AND TRADEMARK OFFICE
CERTIFICATE OF CORRECTION

| | | |
|---|---|---|
| PATENT NO. | : 12,230,281 B2 | Page 1 of 1 |
| APPLICATION NO. | : 17/400872 | |
| DATED | : February 18, 2025 | |
| INVENTOR(S) | : Franz Reutelhuber et al. | |

It is certified that error appears in the above-identified patent and that said Letters Patent is hereby corrected as shown below:

In the Claims

In Claim 27, Column 45, Line 32, immediately following "of", please delete "as"

In Claim 29, Column 47, Line 54, immediately following "wherein", please delete "I" and insert therefore --l--

In Claim 38, Column 53, Line 23, immediately following "representations,", please delete "and"

In Claim 38, Column 53, Line 57, immediately following "2|,", please delete ")" and insert therefor --(--

In Claim 38, Column 55, Line 4, immediately following "wherein", please delete "I" and insert therefore --l--

In Claim 40, Column 60, Line 53, immediately following "wherein", please delete "I" and insert therefore --l--

Signed and Sealed this
Third Day of June, 2025

Coke Morgan Stewart
*Acting Director of the United States Patent and Trademark Office*